(12) United States Patent
Tsuchiya et al.

(10) Patent No.: US 12,046,612 B2
(45) Date of Patent: Jul. 23, 2024

(54) SEMICONDUCTOR PHOTODETECTION DEVICE HAVING A PLURALITY OF AVALANCHE PHOTODIODES

(71) Applicant: HAMAMATSU PHOTONICS K.K., Hamamatsu (JP)

(72) Inventors: Ryutaro Tsuchiya, Hamamatsu (JP); Terumasa Nagano, Hamamatsu (JP); Takashi Baba, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 188 days.

(21) Appl. No.: 17/260,324

(22) PCT Filed: Jun. 10, 2019

(86) PCT No.: PCT/JP2019/022950
§ 371 (c)(1),
(2) Date: Jan. 14, 2021

(87) PCT Pub. No.: WO2020/017188
PCT Pub. Date: Jan. 23, 2020

(65) Prior Publication Data
US 2021/0296387 A1   Sep. 23, 2021

(30) Foreign Application Priority Data

Jul. 18, 2018 (JP) ................................. 2018-135253
Aug. 2, 2018 (JP) ................................. 2018-146230

(51) Int. Cl.
*H01L 27/146* (2006.01)
*H04N 25/766* (2023.01)
(Continued)

(52) U.S. Cl.
CPC .... *H01L 27/14623* (2013.01); *H01L 27/1463* (2013.01); *H01L 27/14636* (2013.01);
(Continued)

(58) Field of Classification Search
CPC .......... H01L 27/14623; H01L 27/1463; H01L 27/14636; H01L 27/14643;
(Continued)

(56) References Cited

U.S. PATENT DOCUMENTS 9,864,074 B1 * 1/2018 Newman ................ G01T 1/2002
10,658,415 B2 * 5/2020 Ishida ............. H01L 31/035281
(Continued)

FOREIGN PATENT DOCUMENTS

CN          1836331 A      9/2006
CN        101105531 A      1/2008
(Continued)

OTHER PUBLICATIONS

International Preliminary Report on Patentability mailed Jan. 28, 2021 for PCT/JP2019/022609.
(Continued)

*Primary Examiner* — Nduka E Ojeh
*Assistant Examiner* — Laura M Dykes
(74) *Attorney, Agent, or Firm* — Faegre Drinker Biddle & Reath LLP

(57) ABSTRACT

A semiconductor substrate has a first main surface and a second main surface that oppose each other and a plurality of cells that are arrayed two-dimensionally in a matrix. Each cell includes at least one avalanche photodiode arranged to operate in a Geiger mode. A trench penetrating through the semiconductor substrate is formed in the semiconductor substrate to surround each cell when viewed in a direction orthogonal to the first main surface. A light-shielding member optically separates mutually adjacent cells of the plurality of cells. The light-shielding member includes a first portion extending in a thickness direction of the semiconductor substrate between an opening end of the trench at the first main surface and an opening end of the trench at the
(Continued)

second main surface and a second portion projecting out from the second main surface. The insulating film includes a portion that covers the second portion.

9 Claims, 13 Drawing Sheets

(51) Int. Cl.
　　*G01S 7/497*　　　(2006.01)
　　*G01S 17/89*　　　(2020.01)
　　*H01L 31/107*　　(2006.01)
(52) U.S. Cl.
　　CPC .. *H01L 27/14643* (2013.01); *H01L 27/14685* (2013.01); *H04N 25/766* (2023.01); *G01S 7/497* (2013.01); *G01S 17/89* (2013.01); *H01L 31/107* (2013.01)
(58) Field of Classification Search
　　CPC ............. H01L 27/14685; H01L 31/107; H01L 27/1446; G01S 17/89; G01S 7/481; G01S 7/4863
　　USPC ........................................................ 257/435
　　See application file for complete search history.

(56) References Cited

U.S. PATENT DOCUMENTS

| | | | |
|---|---|---|---|
| 2007/0222678 | A1 | 9/2007 | Ishio et al. |
| 2008/0308738 | A1* | 12/2008 | Li .................... H01L 31/107 250/370.11 |
| 2009/0121306 | A1 | 5/2009 | Ishikawa |
| 2012/0057056 | A1* | 3/2012 | Oike .................... H04N 5/2253 348/294 |
| 2015/0285625 | A1 | 10/2015 | Deane |
| 2016/0254310 | A1 | 9/2016 | Yagi et al. |
| 2018/0090536 | A1 | 3/2018 | Mandai et al. |
| 2018/0315738 | A1* | 11/2018 | Bono ................ H01L 25/0753 |
| 2019/0252442 | A1* | 8/2019 | Tanaka ............. H01L 27/14629 |
| 2021/0183928 | A1* | 6/2021 | Hoshi ............... H01L 27/14685 |

FOREIGN PATENT DOCUMENTS

| | | |
|---|---|---|
| CN | 101563779 A | 10/2009 |
| CN | 201741697 U | 2/2011 |
| CN | 104101880 A | 10/2014 |
| CN | 105009289 A | 10/2015 |
| CN | 205050839 U | 2/2016 |
| CN | 106165399 A | 11/2016 |
| CN | 106489093 A | 3/2017 |
| CN | 108139468 A | 6/2018 |
| DE | 102016008904 A1 | 1/2018 |
| JP | 2006-179828 A | 7/2006 |
| JP | 2007-273934 A | 10/2007 |
| JP | 2008-311651 A | 12/2008 |
| JP | 2010-091378 A | 4/2010 |
| JP | 2010-536186 A | 11/2010 |
| JP | 2012-60012 A | 3/2012 |
| JP | 2012-068066 A | 4/2012 |
| JP | 2014-059301 A | 4/2014 |
| JP | 2014-077658 A | 5/2014 |
| JP | 2015-078953 A | 4/2015 |
| JP | 2015-084392 A | 4/2015 |
| JP | 2015-179087 A | 10/2015 |
| JP | 2016-211881 A | 12/2016 |
| JP | 2016-540979 A | 12/2016 |
| JP | 2017-520134 A | 7/2017 |
| JP | 2018-088488 A | 6/2018 |
| TW | 201203528 A | 1/2012 |
| TW | 201637188 A | 10/2016 |
| WO | WO 2009/022166 A2 | 2/2009 |
| WO | WO 2015/076880 A1 | 5/2015 |
| WO | WO-2015/157341 A1 | 10/2015 |
| WO | WO-2017/059777 A1 | 4/2017 |
| WO | WO-2017/180277 A1 | 10/2017 |
| WO | WO-2018/021413 A1 | 2/2018 |
| WO | WO 2018/101033 A1 | 6/2018 |

OTHER PUBLICATIONS

International Preliminary Report on Patentability mailed Jan. 28, 2021 for PCT/JP2019/022950.

* cited by examiner (b)

(c)

(b)

(c)

(a)

(b)

(c)

SEMICONDUCTOR PHOTODETECTION DEVICE HAVING A PLURALITY OF AVALANCHE PHOTODIODES

TECHNICAL FIELD

The present invention relates to a semiconductor photodetection device.

BACKGROUND ART

A semiconductor photodetection device that includes a plurality of cells each including an avalanche photodiode arranged to operate in a Geiger mode is known (for example, Patent Literature 1). Patent Literature 1 discloses a photodiode array (semiconductor photodetection device) that makes use of avalanche multiplication. With this semiconductor photodetection device, a plurality of avalanche photodiodes are formed on a semiconductor substrate. Mutually adjacent avalanche photodiodes (cells) are separated from each other by a separating portion formed of a trench.

CITATION LIST

Patent Literature

Patent Literature 1: Japanese Unexamined Patent Publication No. 2006-179828

SUMMARY OF INVENTION

Technical Problem

An object of one aspect of the present invention is to provide a semiconductor photodetection device that reduces optical crosstalk even more reliably.

Solution to Problem

In a process of avalanche multiplication, an avalanche photodiode may generate secondary light different from incident light. When the secondary light is incident on an adjacent cell, the avalanche photodiode included in the adjacent cell may perform avalanche multiplication of a carrier generated by the incident secondary light. The phenomenon in which the secondary light is incident on the adjacent cell is called optical crosstalk.

A light-shielding member disposed inside the trench reduces the optical crosstalk mentioned above. For example, with the semiconductor photodetection device described in Patent Literature 1, a low refractive index substance is disposed inside the trench as the light-shielding member. The low refractive index substance has a lower refractive index than the semiconductor substrate. The low refractive index substance reflects plasma emission generated during carrier multiplication in the avalanche photodiode.

The present inventors carried out intensive research on a configuration that reduces optical crosstalk even more reliably. As a result, the present inventors found out a configuration in which a light-shielding member includes a portion that projects out from a semiconductor substrate. Hereinafter, the portion projecting out from the semiconductor substrate will be referred to as the "projecting portion". With the configuration in which the light-shielding member includes the projecting portion, secondary light is prevented even more reliably from being incident on an avalanche photodiode in an adjacent cell in comparison to a configuration in which the light-shielding member does not include the projecting portion.

The present inventors also found that a new problem arises when the light-shielding member includes the projecting portion. The projecting portion is less likely to be protected by the semiconductor substrate in comparison to a portion of the light-shielding member that is positioned inside the semiconductor substrate (trench). The projecting portion may thus be exposed to an atmospheric environment outside the semiconductor substrate. In this case, the light-shielding member, including the projecting portion, may corrode. If the light-shielding member corrodes, the light-shielding member is unlikely to reduce optical crosstalk.

The present inventors found out a configuration in which an insulating layer covers the projecting portion. With this configuration, even if the light-shielding member includes the projecting portion, it is unlikely to be exposed to the atmospheric environment outside the semiconductor substrate. The light-shielding member is thus unlikely to corrode and the light-shielding member reduces optical crosstalk reliably.

A semiconductor photodetection device according to one aspect of the present invention includes a semiconductor substrate having a first main surface and a second main surface that oppose each other and a plurality of cells that are arrayed two-dimensionally in a matrix, a first wire that is electrically connected to each of the plurality of cells, a second wire that is electrically connected to each of the plurality of cells, a light-shielding member that optically separates mutually adjacent cells of the plurality of cells, and an insulating film that covers the light-shielding member. The first wire is disposed on the first main surface of the semiconductor substrate. The second wire is disposed on the first main surface of the semiconductor substrate. Each of the plurality of cells includes at least one avalanche photodiode arranged to operate in a Geiger mode. The avalanche photodiode includes a first semiconductor region and a second semiconductor region of a conductivity type differing from the first semiconductor region. The first semiconductor region and the second semiconductor region form a portion of the first main surface. The first wire is electrically connected to the first semiconductor region of the avalanche photodiode included in each of the plurality of cells. The second wire is electrically connected to the second semiconductor region of the avalanche photodiode included in each of the plurality of cells. A trench penetrating through the semiconductor substrate is formed in the semiconductor substrate to surround each of the plurality of cells when viewed in a direction orthogonal to the first main surface. The light-shielding member includes a first portion extending in a thickness direction of the semiconductor substrate between an opening end of the trench at the first main surface and an opening end of the trench at the second main surface and a second portion projecting out from the second main surface. The insulating film includes a portion that covers the second portion.

With the semiconductor photodetection device according to the one aspect of the present invention, the light-shielding member includes not just the first portion but also the second portion that projects out from the second main surface and therefore, as mentioned above, with this one aspect, secondary light is prevented even more reliably from being incident on an avalanche photodiode in an adjacent cell.

With this one aspect, the insulating film includes the portion that covers the second portion and therefore, the second portion is unlikely to be exposed to an atmospheric environment outside the semiconductor substrate. Therefore, as mentioned above, with this one aspect, the light-shielding member is unlikely to corrode and the light-shielding member reduces optical crosstalk reliably.

With the semiconductor photodetection device according to the one aspect, the light-shielding member may be made of a material that reflects light. With the present configuration, light, which is incident toward the light-shielding member among the light incident on the semiconductor photodetection device, is reflected by the light-shielding member. A portion of the light that is incident toward the light-shielding member may thus be reflected toward a pn junction formed in an avalanche photodiode. Therefore, with the present configuration, an amount of photoelectrons generated in the avalanche photodiodes may increase in comparison to a case where the light-shielding member is made of a material that absorbs light. Consequently, sensitivity of the semiconductor photodetection device may be improved.

With the semiconductor photodetection device according to the one aspect, each region of the semiconductor substrate surrounded by the trench may include a first region positioned at an inner side and a second region positioned at an outer side of the first region to surround the first region when viewed in the direction orthogonal to the first main surface. The second main surface may include a tapered surface that is inclined such that a length of the second region in the thickness direction of the semiconductor substrate increases as a distance to the trench decreases. With the present configuration, a portion of light, which is directed toward the tapered surface among the light incident on the semiconductor photodetection device, may be reflected by the tapered surface toward a pn junction formed in an avalanche photodiode. Therefore, with the present configuration, the amount of photoelectrons generated in the avalanche photodiodes may increase in comparison to a case where the entire second main surface is flat. Consequently, sensitivity of the semiconductor photodetection device may be improved.

With the semiconductor photodetection device according to the one aspect, the insulating film may include a portion that contacts a side surface of the trench and covers the first portion. The portion that covers the second portion and the portion that covers the first portion may be formed integrally. With the present configuration, the portion of the insulating film that covers the first portion secures electrical insulation between the semiconductor substrate and the light-shielding member. The light-shielding member is covered reliably and durability of the light-shielding member is improved because the portion that covers the second portion and the portion that covers the first portion are formed integrally. Therefore, with the present configuration, optical crosstalk is reduced even more reliably in comparison to a configuration where the portion that covers the second portion and the portion that covers the first portion are formed as separate bodies.

The semiconductor photodetection device according to the one aspect may further include a holding member that holds the semiconductor substrate and an adhesive layer that adheres the holding member and the second main surface together. The second portion and the portion of the insulating film that covers the second portion may be positioned inside the adhesive layer. With the present configuration, the second portion of the light-shielding member that projects out from the second main surface of the semiconductor substrate is held by the adhesive layer. Therefore, a force of holding the light-shielding member is improved, for example, in comparison to a case where the portion of the insulating film that covers the second portion is exposed to the exterior of the semiconductor substrate.

With the semiconductor photodetection device according to the one aspect, the plurality of cells may be arrayed two-dimensionally in M rows and N columns (M and N are integers not less than 2). The first wire may include a plurality of first branch wires that are respectively provided for each of M first cell groups each including N cells aligned in a row direction. The second wire may include a plurality of second branch wires that are respectively provided for each of N second cell groups each including M cells aligned in a column direction. Each first branch wire may be electrically connected to the N cells included in the corresponding first cell group among the M first cell groups. Each second branch wire may be electrically connected to the M cells included in the corresponding second cell group among the N second cell groups.

With the present configuration, a first branch wire is provided for each row and a second branch wire is provided for each column. Therefore, for example, in a case where each of the plurality of cells is to be connected to common potentials via each of the first wire and the second wire, the number of wires on the first main surface is lessened in comparison to a case where wires are respectively provided for each cell. The present configuration thus simplifies the configuration of the first wire and the second wire that are electrically connected to the avalanche photodiode included in each cell.

With the semiconductor photodetection device according to the one aspect, the plurality of cells may be arrayed two-dimensionally in M rows and N columns (M and N are integers not less than 2). The first wire may include a plurality of first branch wires. The second wire may include a plurality of second branch wires. Each of the plurality of first branch wires and each of the plurality of second branch wires may be provided alternately along a column direction in which M cells are aligned. Each first branch wire may be electrically connected to (2×N) cells included in first cell groups of the (2×m−1)th row and the (2×m)th row among M first cell groups each including N cells aligned in a row direction. Each second branch wire may be electrically connected to (2×N) cells included in first cell groups of the (2×m)th row and the (2×m+1)th row among the M first cell groups. m may be an integer not less than 1.

With the present configuration, the first branch wires and the second branch wires are provided alternately according to each row. Therefore, for example, in a case where each of the plurality of cells is to be connected to common potentials via each of the first wire and the second wire, the number of wires on the first main surface is lessened in comparison to a case where wires are respectively provided for each cell. The present configuration thus simplifies the configuration of the first wire and the second wire electrically connected to the avalanche photodiode included in each cell.

With the semiconductor photodetection device according to the one aspect, each second branch wire may be connected to the second semiconductor region of the avalanche photodiode included in the corresponding cell among the plurality of cells. The shortest distance between the first semiconductor region and a connection portion of the second branch wire and the second semiconductor region may be greater than the shortest distance between the first semiconductor region and the trench. With the present configuration, in comparison to a configuration where the shortest distance between the abovementioned connection portion and the first semiconductor region is not more than the shortest distance between the first semiconductor region and the trench, the second branch wire and the first semiconductor region are unlikely to become short-circuited even when a bias voltage is applied to the avalanche photodiodes. The present configuration thus improves a withstand voltage between the second branch wire and the first semiconductor region.

Advantageous Effects of Invention

By the one aspect of the present invention, the semiconductor photodetection device that reduces optical crosstalk even more reliably is provided.

DESCRIPTION OF EMBODIMENT

Figure 1:
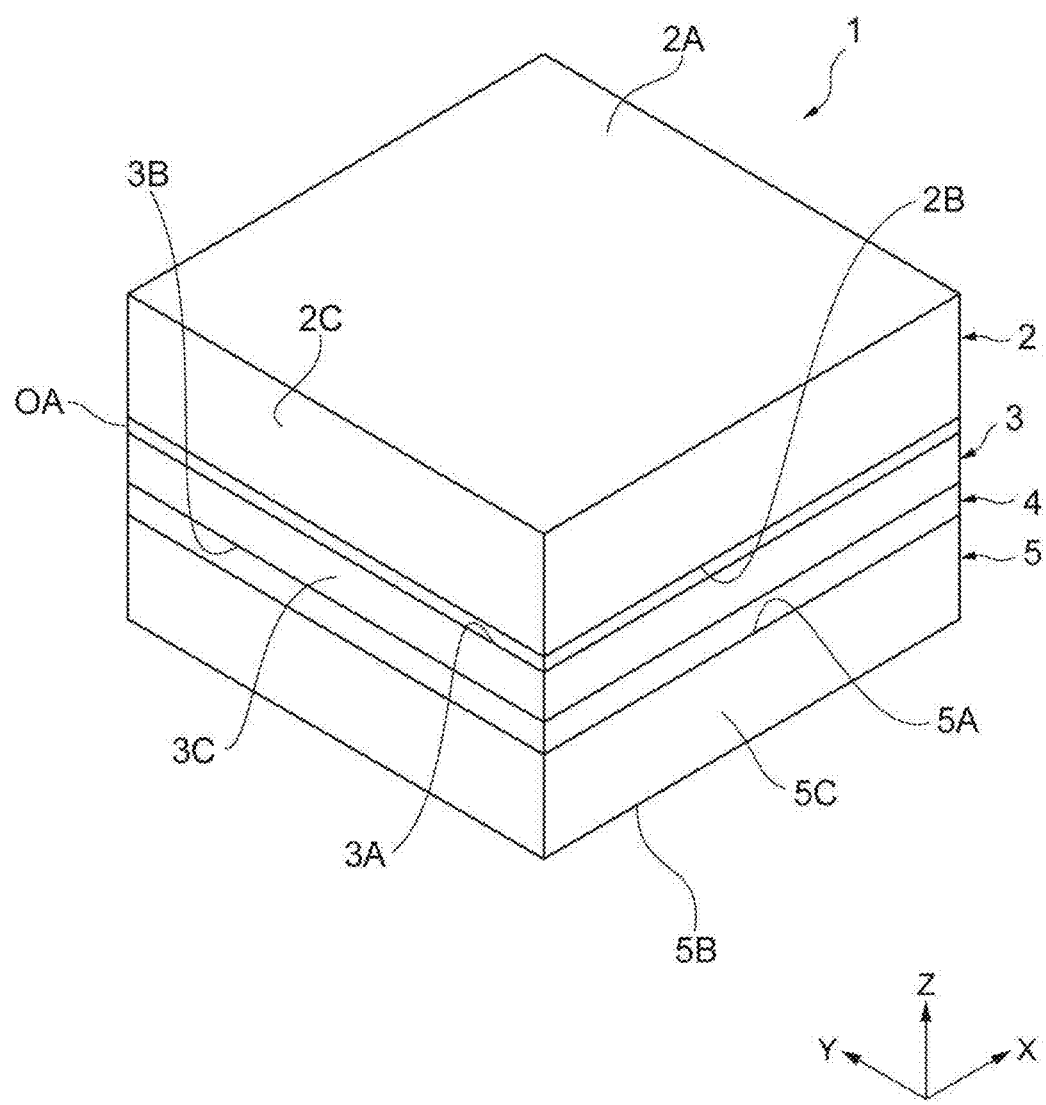
FIG. 1 is a schematic configuration diagram of a semiconductor photodetection device according to a first embodiment.

Embodiments of the present invention will be hereinafter described in detail with reference to the attached drawings. In the description, the same reference numerals are used for the same elements or elements having the same functions, and redundant description is omitted.

First, a semiconductor photodetection device according to a first embodiment will be described with reference to FIG. 1 to FIG. 6.

Figure 2:
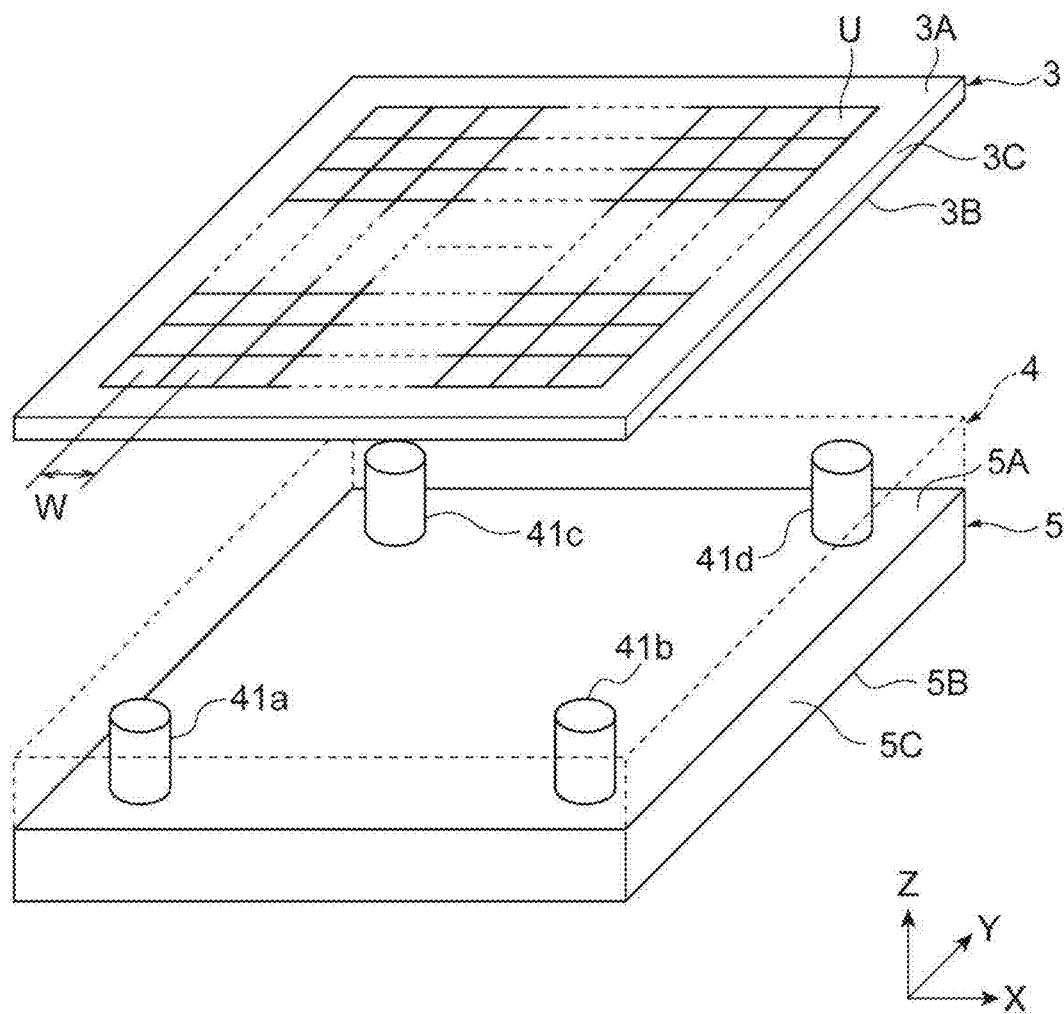
FIG. 2 is a perspective view showing a portion of the semiconductor photodetection device shown in FIG. 1.
Figure 3:
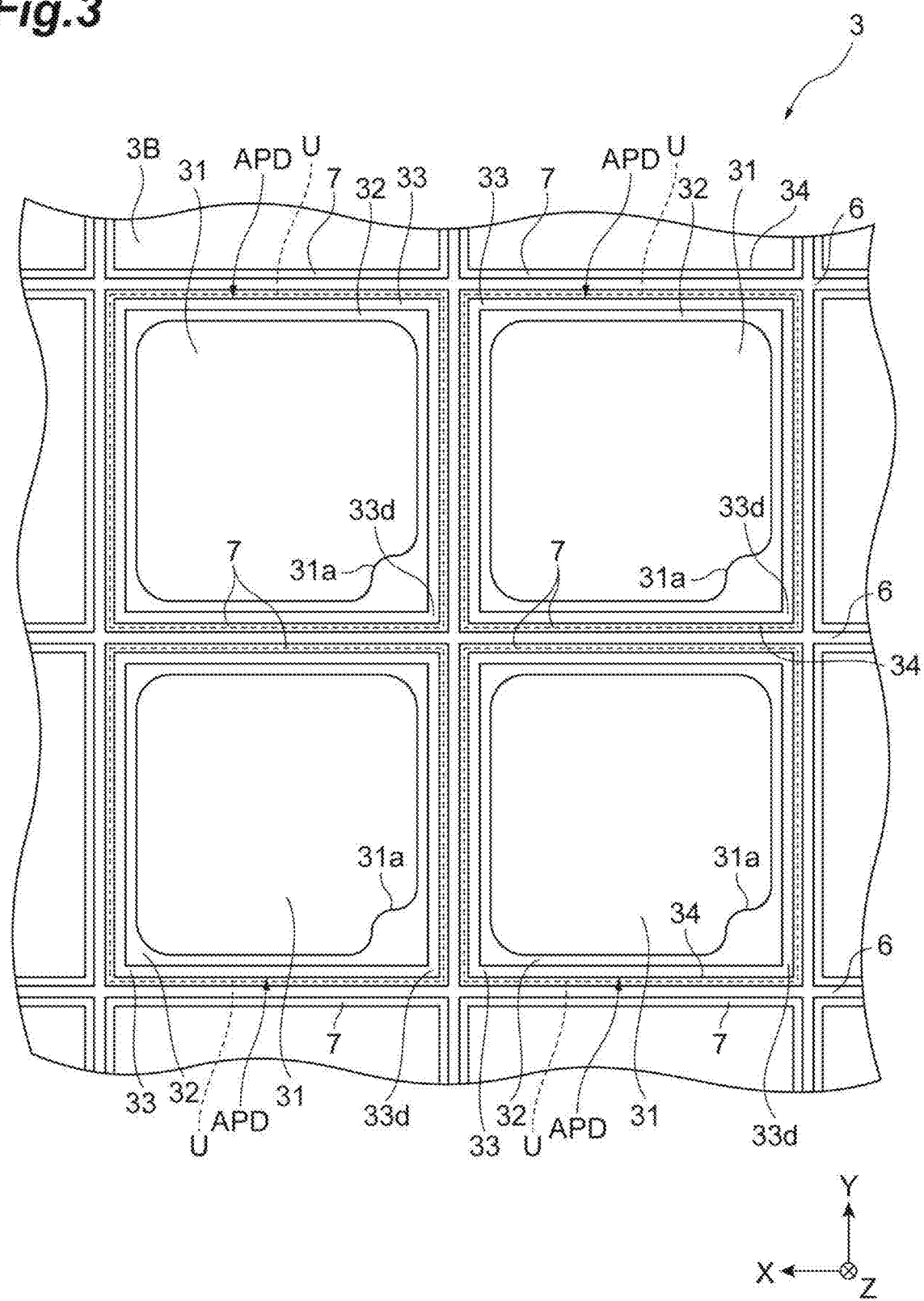
FIG. 3 is a plan view of a semiconductor substrate shown in FIG. 1.
Figure 4:
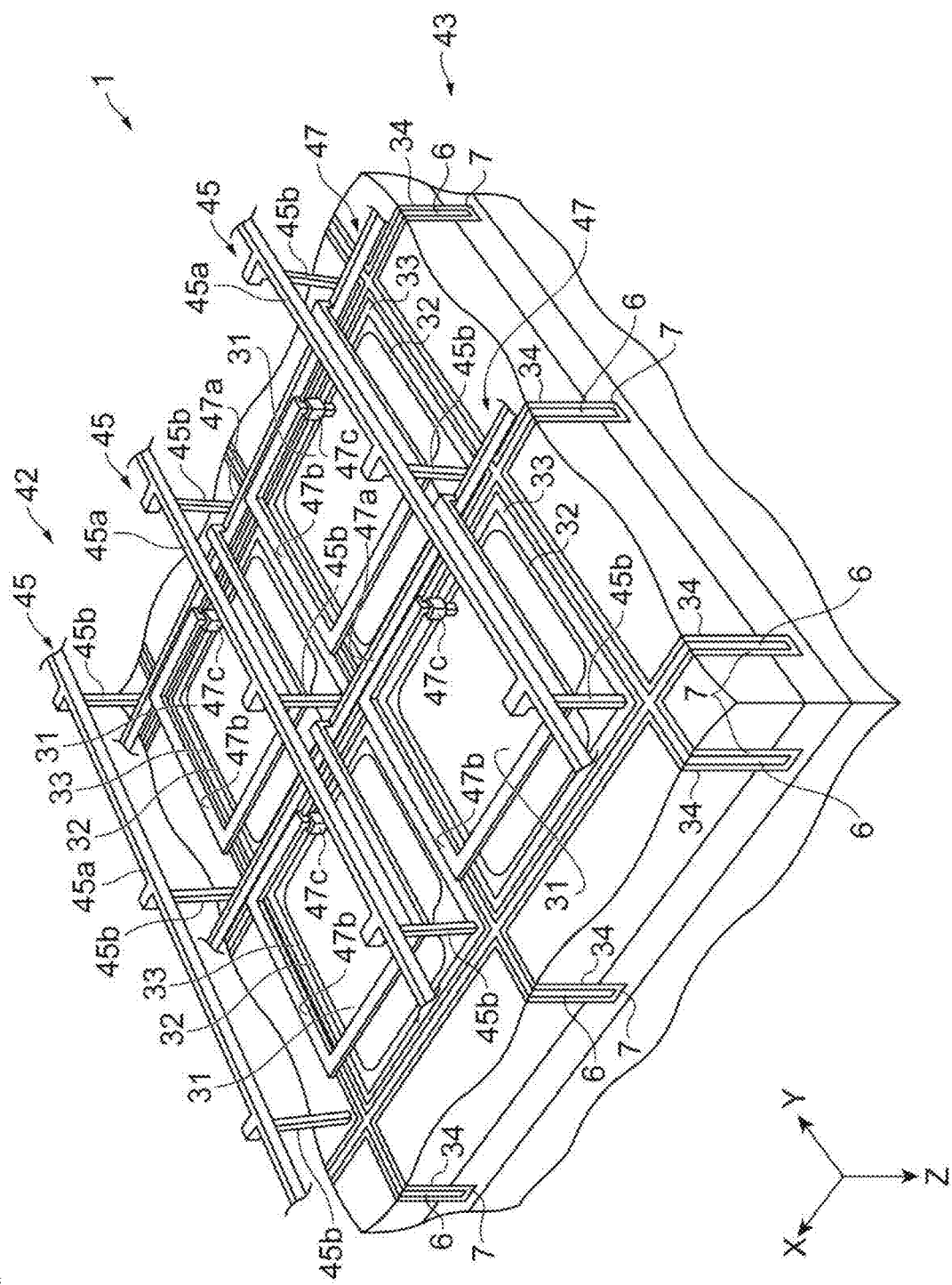
FIG. 4 is a perspective view showing the semiconductor substrate shown in FIG. 1.
Figure 5:
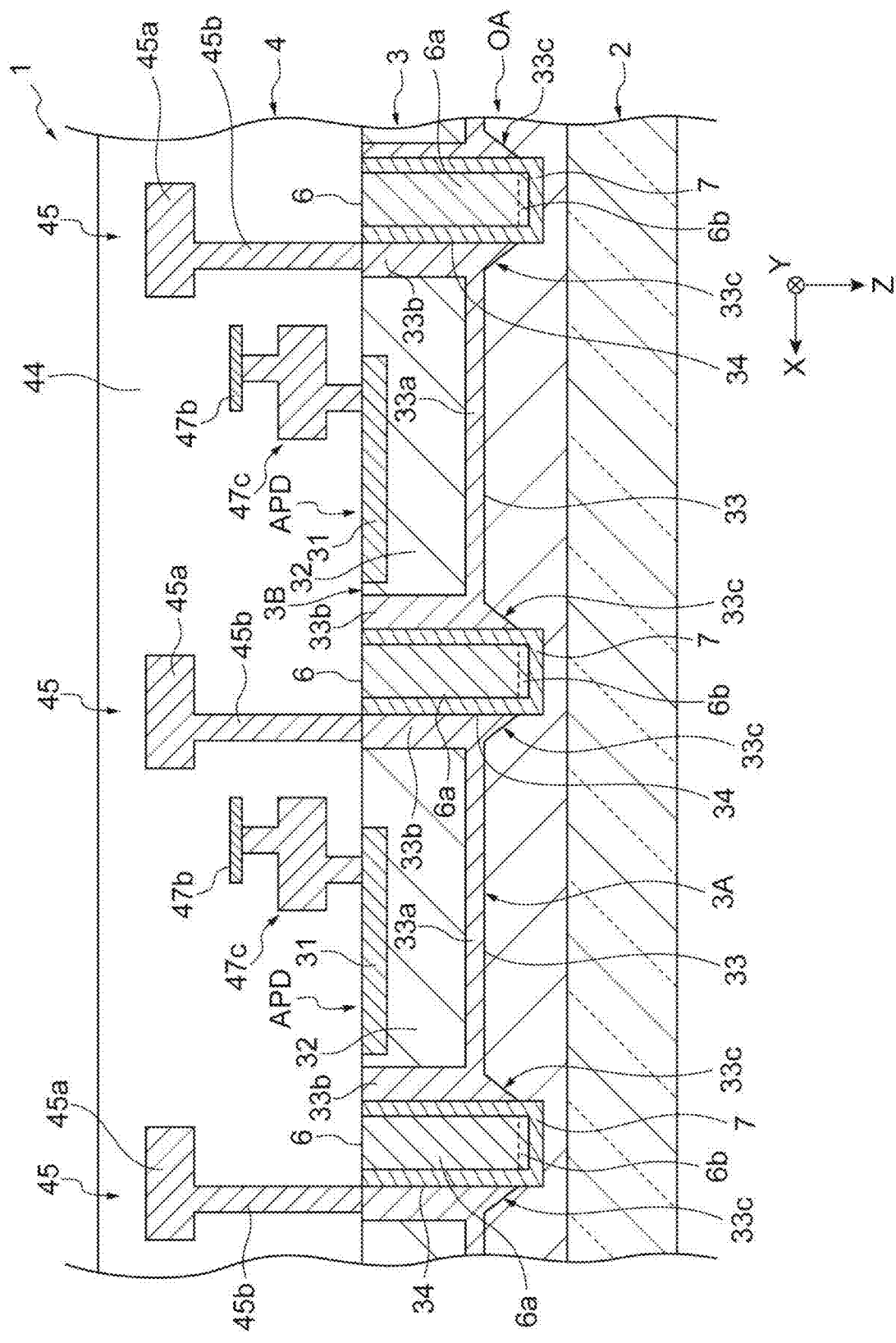
FIG. 5 is a diagram showing a sectional configuration of the semiconductor photodetection device shown in FIG. 1.
Figure 6:
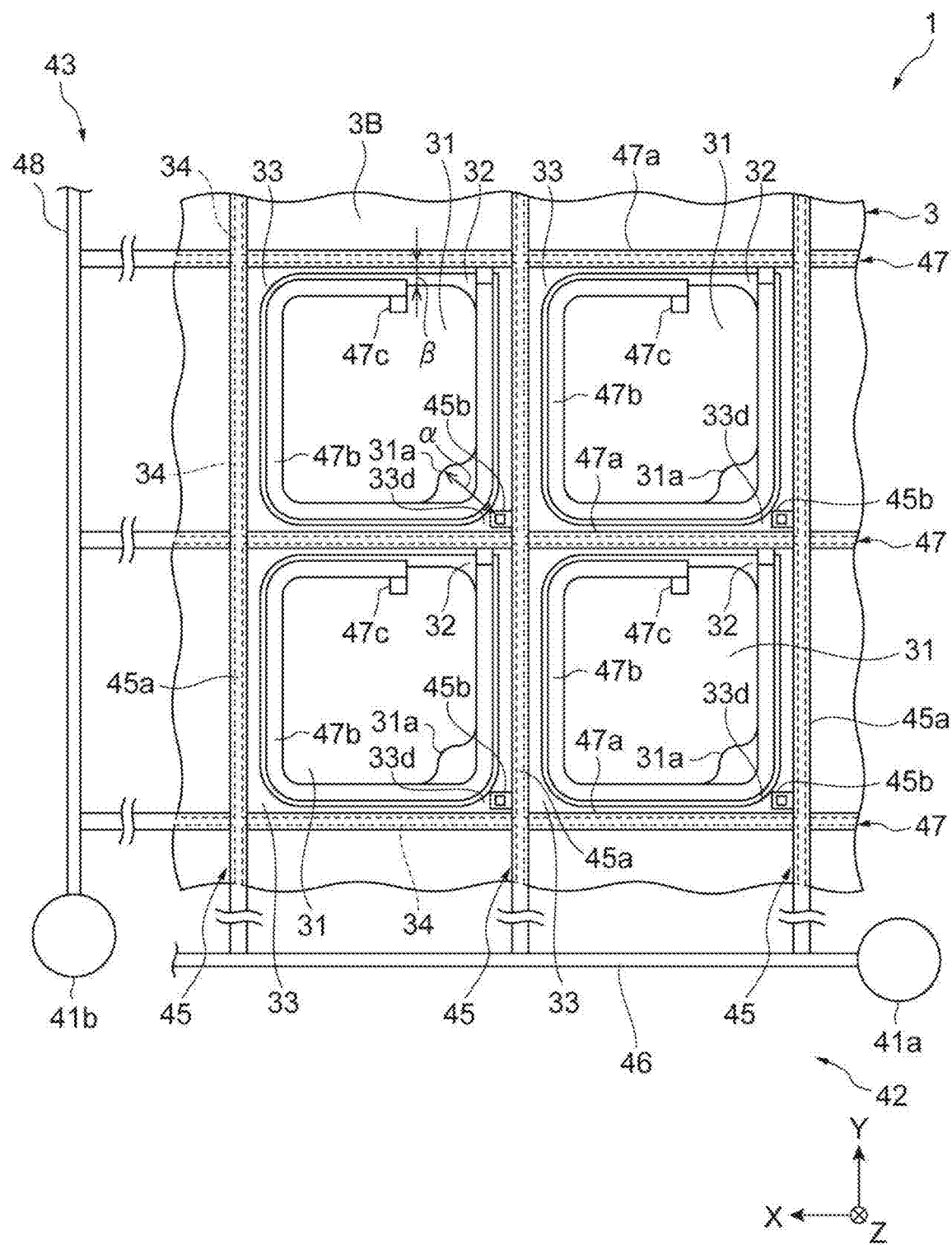
FIG. 6 is a plan view showing the semiconductor substrate shown in FIG. 1.

FIG. 1 is a schematic configuration diagram of a semiconductor photodetection device according to a first embodiment. FIG. 2 is a perspective view showing a portion of the semiconductor photodetection device shown in FIG. 1. FIG. 3 is a plan view of a semiconductor substrate shown in FIG. 1. FIG. 4 is a perspective view showing the semiconductor substrate shown in FIG. 1. FIG. 5 is a diagram showing a sectional configuration of the semiconductor photodetection device shown in FIG. 1. FIG. 6 is a plan view showing the semiconductor substrate shown in FIG. 1.

As shown in FIG. 1, the semiconductor photodetection device 1 includes a glass substrate 2, a semiconductor substrate 3, a wiring layer 4, and a circuit board 5. The glass substrate 2, the semiconductor substrate 3, the wiring layer 4, and the circuit board 5 are disposed in that order in a Z-axis direction. In the present embodiment, the glass substrate 2, the semiconductor substrate 3, the wiring layer 4, and the circuit board 5 have rectangular shapes in plan view. The semiconductor photodetection device 1 is, for example, disposed such that light to be detected is incident on the glass substrate 2 and detects incident light, which is the light made incident.

The glass substrate 2 is made of a transparent glass material that transmits light. The glass substrate 2 has a main surface 2A and a main surface 2B, which oppose each other, and side surfaces 2C. The main surface 2A and the main surface 2B are flat surfaces. The glass substrate 2 is adhered to the semiconductor substrate 3 by an optical adhesive OA. The optical adhesive OA is, for example, a resin having a light transmitting property. The glass substrate 2 may be formed directly on the semiconductor substrate 3. The glass substrate 2 has a function of holding the semiconductor substrate 3. For example, the glass substrate 2 constitutes a holding member and the optical adhesive OA constitutes an adhesive layer.

The semiconductor substrate 3 is made of Si (silicon), and is a p-type conductivity semiconductor substrate. The semiconductor substrate 3 has a main surface 3A and a main surface 3B, which oppose each other, and side surfaces 3C. The main surface 3A of the semiconductor substrate 3 and the main surface 2B of the glass substrate 2 oppose each other via the optical adhesive OA. The main surface 3A is a surface onto which light to the semiconductor substrate 3 is incident. In the present embodiment, incident light is incident on the semiconductor substrate 3 upon transmission through the glass substrate 2. For example, when the main surface 3B is the first main surface, the main surface 3A is the second main surface. The detailed configuration of the semiconductor substrate 3 will be described below.

The wiring layer 4 is disposed between the semiconductor substrate 3 and the circuit board 5. The wiring layer 4 is provided at the main surface 3B of the semiconductor substrate 3. The wiring layer 4 has a function of electrically connecting the semiconductor substrate 3 and the circuit board 5. The detailed configuration of the wiring layer 4 will be described below.

The circuit board 5 has a main surface 5A and a main surface 5B, which oppose each other, and side surfaces 5C. The main surface 5A of the circuit board 5 and the main surface 3B of the semiconductor substrate 3 oppose each other via the wiring layer 4. In the present embodiment, a side surface 2C of the glass substrate 2, a side surface 3C of the semiconductor substrate 3, and a side surface 5C of the circuit board 5 are flush with each other. In other words, in plan view, respective outer edges of the glass substrate 2, the semiconductor substrate 3, and the circuit board 5 are matched to each other. The respective outer edges of the glass substrate 2, the semiconductor substrate 3, and the circuit board 5 do not have to be matched to each other. For example, in plan view, an area of the circuit board 5 may be larger than respective areas of the glass substrate 2 and the semiconductor substrate 3. In this case, the side surfaces 5C of the circuit board 5 are positioned further outward in an XY axis plane than the side surfaces 2C of the glass substrate 2 and the side surfaces 3C of the semiconductor substrate 3. The circuit board 5 constitutes, for example, an ASIC (Application Specific Integrated Circuit). In the present embodiment, a plane parallel to the respective main surfaces of the semiconductor substrate 3 and the circuit board 5 is the XY axis plane and a direction orthogonal to the respective main surfaces is the Z axis direction.

In FIG. 2, the semiconductor substrate 3, the wiring layer 4, and the circuit board 5 of the semiconductor photodetection device 1 are shown schematically. In FIG. 2, illustration of the glass substrate 2 is omitted and an interior of the wiring layer 4 is shown. The semiconductor substrate 3 includes a plurality of cells U that are arrayed two-dimensionally in a matrix. In other words, the plurality of cells U are arrayed two-dimensionally in M rows and N columns. M and N are integers not less than 2. The number of the cells U is, for example, "1024 (32 rows×32 columns)". An interval W between mutually adjacent cells U is, for example, approximately 10 to 500 μm. With the semiconductor substrate 3, a signal in accordance with incident light incident on each cell U is output from each cell U. Each of the plurality of cells U includes one or a plurality of avalanche photodiodes APD. In the following, a case where each of the plurality of cells U includes one avalanche photodiode APD will be described as an example.

The wiring layer 4 includes a plurality (four, in the present embodiment) of bump electrodes 41a to 41d. The bump electrodes 41a to 41d are provided at positions corresponding to corner portions of the semiconductor substrate 3 and corner portions of the circuit board 5 in the XY axis plane. With each of the bump electrodes 41a to 41d, one side surface among a pair of side surfaces opposing each other in the Z axis direction is connected to an electrode pad included in the wiring layer 4 and the other side surface is connected to an electrode pad provided on the main surface 5A of the circuit board 5. In other words, in the Z axis direction, an overall length of the wiring layer 4 is greater than a length of each of the bump electrodes 41a to 41d. In the present embodiment, wires of the wiring layer 4 electrically connected to an anode of each avalanche photodiode APD are electrically connected via the bump electrode 41a to the circuit board 5. Wires of the wiring layer 4 electrically connected to a cathode of each avalanche photodiode APD are electrically connected via the bump electrode 41b to the circuit board 5. The bump electrode 41c and the bump electrode 41d are dummy bump electrodes and serve a role of preventing the semiconductor substrate 3 from becoming inclined with respect to the circuit board 5.

As shown in FIG. 3 and FIG. 4, each avalanche photodiode APD includes an n-type conductivity semiconductor region 31, and a p-type conductivity semiconductor region 32. The semiconductor region 31 and the semiconductor region 32 form a pn junction of the avalanche photodiode APD. Each avalanche photodiode APD includes a p-type conductivity semiconductor region 33. An impurity concentration of the semiconductor region 33 is higher than an impurity concentration of the semiconductor region 32. When incident light enters each avalanche photodiode APD in a state where a bias voltage is applied, a signal (current signal) in accordance with the incident light is generated in each avalanche photodiode APD. The bias voltage is not less than a breakdown voltage of each avalanche photodiode APD. In other words, each avalanche photodiode APD operates in a Geiger mode when the bias voltage is applied. For example, when the semiconductor region 31 is a first semiconductor region, a semiconductor region constituted of the semiconductor region 32 and the semiconductor region 33 is a second semiconductor region.

As shown in FIG. 5, the semiconductor region 32 surrounds the semiconductor region 31 (side surfaces and bottom surface), and the semiconductor region 33 surrounds the semiconductor region 32 (side surfaces and bottom surface). The semiconductor region 33 includes a region 33a, opposing the semiconductor region 31 via the semiconductor region 32, and a region 33b, connected to the region 33a. The region 33b intersects with or is orthogonal to the region 33a when viewed in an X axis direction or a Y axis direction. When viewed in the Z axis direction, the region 33b has a frame shape. In other words, when viewed in the Z axis direction, the region 33b surrounds a semiconductor region constituted of the semiconductor region 31, the semiconductor region 32, and the region 33a. In the present embodiment, the region 33b has a rectangular frame shape when viewed in the Z axis direction. In each avalanche photodiode APD, the semiconductor region 31, the semiconductor region 32, and the region 33b of the semiconductor region 33 form the main surface 3B of the semiconductor substrate 3. In other words, each of the semiconductor region 31, the semiconductor region 32, and the region 33b form a portion of the main surface 3B. In each avalanche photodiode APD, the region 33a and the region 33b (the semiconductor region 33) form the main surface 3A of the semiconductor substrate 3. In the present embodiment, the region 33a, the semiconductor region 32, and the semiconductor region 31 are disposed in that order from the optical adhesive OA (the glass substrate 2) in the Z axis direction. A peripheral edge of the semiconductor region 33 when viewed in the Z axis direction forms a peripheral edge of each avalanche photodiode APD (each cell U).

A trench 34 is formed in the semiconductor substrate 3. Outer side surfaces in the X axis direction or the Y axis direction of the regions 33b of the semiconductor regions 33 form side surfaces of the trench 34. The trench 34 opens to the main surface 3A and the main surface 3B. In other words, the trench 34 penetrates through the semiconductor substrate 3 in a direction (the Z axis direction) in which the main surface 3A and the main surface 3B oppose each other. The Z axis direction is also a thickness direction of the semiconductor substrate 3. The trench 34 physically separates mutually adjacent cells U, among the plurality of cells U, from each other. Specifically, the trench 34 surrounds each of the plurality of cells U when viewed in a direction (the Z axis direction) orthogonal to the main surface 3A. Mutually adjacent cells U are thus electrically separated from each other by the trench 34. The trench 34 is formed in a lattice in the semiconductor substrate 3 when viewed in the Z axis direction. In the present embodiment, the trench 34 is formed in a substantially square lattice in the semiconductor substrate 3 when viewed in the Z axis direction.

The semiconductor photodetection device 1 includes a light-shielding member 6 and an insulating film 7. The light-shielding member 6 is provided in the trench 34 formed in the semiconductor substrate 3. The insulating film 7 covers the light-shielding member 6. The light-shielding member 6 is made of a material that reflects light. The light-shielding member 6 may instead be made of a material that absorbs light without reflecting it. The material included in the light-shielding member 6 is, for example, tungsten. The light-shielding member 6, covered by the insulating film 7, is disposed to fill the trench 34 and projects out toward the glass substrate 2 from the main surface 3A. The light-shielding member 6 includes a portion 6a, positioned inside the trench 34, and a portion 6b, projecting out from the main surface 3A of the semiconductor substrate 3.

The portion 6b of the light-shielding member 6 is positioned inside the optical adhesive OA. The portion 6a of the light-shielding member 6 is positioned inside the trench 34 to surround each of the plurality of cells U when viewed in the Z axis direction. A length of the portion 6a of the light-shielding member 6 in the Z axis direction is substantially the same as a length of the trench 34 in the Z axis direction. In other words, the portion 6a of the light-shielding member 6 extends in the Z axis direction between an opening end at the main surface 3B and an opening end at the main surface 3A of the trench 34. In the present embodiment, positions in the Z axis direction of one end, among both ends in the Z axis direction of the light-shielding member 6, that is close to the main surface 3B and the main surface 3B are substantially the same as each other. The positions in the Z axis direction of the one end, among both ends in the Z axis direction of the light-shielding member 6, that is close to the main surface 3B and the main surface 3B may differ from each other. That is, a surface of the one end of the light-shielding member 6 and the main surface 3B do not have to be flush with each other. The portion 6a of the light-shielding member 6 opposes inner side surfaces of the trench 34 via the insulating film 7. The portion 6a of the light-shielding member 6 is positioned between outer surfaces of respective semiconductor regions 33 of mutually adjacent avalanche photodiodes APD in the X axis direction or the Y axis direction. For example, when the portion 6a constitutes the first portion, the portion 6b constitutes the second portion. The light-shielding member 6 has a shape corresponding to the trench 34 when viewed in the Z axis direction. The light-shielding member 6 has a lattice shape when viewed in the Z axis direction. In the present embodiment, the light-shielding member 6 has a substantially square lattice shape when viewed in the Z axis direction.

The insulating film 7 covers surfaces, other than the surface exposed from the main surface 3B, of the light-shielding member 6. Specifically, side surfaces of the portion 6a of the light-shielding member 6 and a surface of the portion 6b of the light-shielding member 6 are covered by the integrally-formed insulating film 7. In other words, the insulating film 7 includes a portion covering the side surfaces of the portion 6a of the light-shielding member 6 and a portion covering the surface of the portion 6b of the light-shielding member 6. The insulating film 7 (the portion covering the side surfaces of the portion 6a) is positioned between the light-shielding member 6 and the semiconductor region 33. Insulation between the semiconductor region 33 (the avalanche photodiodes APD) and the light-shielding member 6 is thereby secured. The portion of the insulating film 7 covering the surface of the portion 6b of the light-shielding member 6 is positioned inside the optical adhesive OA. In other words, the portion of the insulating film 7 covering the surface of the portion 6b of the light-shielding member 6 contacts the optical adhesive OA. The material including the insulating film 7 is selected, for example, in consideration of an insulating property between the semiconductor region 33 and the light-shielding member 6, a bonding property with the light-shielding member 6. The insulating film 7 is made, for example, of $SiO_2$ (silicon dioxide).

When viewed in the Z axis direction, each region (each avalanche photodiode APD) of the semiconductor substrate 3 surrounded by the trench 34 includes a first region positioned at an inner side and a second region positioned at an outer side of the first region to surround the first region. In the present embodiment, the first region is the semiconductor region constituted of the semiconductor region 31, the semiconductor region 32, and the region 33a of the semiconductor region 33. The second region is a semiconductor region constituted of the region 33b of the semiconductor region 33. The main surface 3A includes a tapered surface 33c that is inclined such that a length of the second region (region 33b) in the Z axis direction increases as a distance to the trench 34 decreases. In the avalanche photodiode APD included in each cell U, the tapered surface 33c formed on the main surface 3A surrounds the first region when viewed in the Z axis direction. The region 33b of the semiconductor region 33 projects out toward the glass substrate 2 from a portion of the main surface 3A that is constituted of the region 33a of the semiconductor region 33. As viewed from a negative direction of the Z axis, an edge of the tapered surface 33c close to the trench 34 forms the peripheral edge of each avalanche photodiode APD.

An example of a detailed configuration of the wiring layer 4 will now be described. The wiring layer 4 includes a wire 42, a wire 43, and an insulating layer 44. The wire 42 applies the bias voltage to the avalanche photodiode APD in each cell U. The wire 43 outputs the signal from the avalanche photodiode APD in each cell U. Illustration of the insulating layer 44 is omitted in FIG. 4 and FIG. 6. In FIG. 5, a sectional configuration of the insulating layer 44 is shown and hatching of the insulating layer 44 is omitted. As mentioned above, mutually adjacent cells U are physically separated from each other by the trench 34 and are thus not electrically connected. Therefore, to make the avalanche photodiode APD included in each cell U operate, the wire 42 and the wire 43 are physically and electrically connected to each cell U.

The wire 42 electrically connects the bump electrode 41a and each of the plurality of cells U. In other words, the circuit board 5 is electrically connected to the anode (semiconductor region 33) of the avalanche photodiode APD included in each cell U via the bump electrode 41a and the wire 42. The wire 43 electrically connects the bump electrode 41b and each of the plurality of cells U. In other words, the circuit board 5 is electrically connected to the cathode (semiconductor region 31) of the avalanche photodiode APD included in each cell U via the bump electrode 41b and the wire 43. The wire 42 and the wire 43 are provided on the main surface 3B of the semiconductor substrate 3. In the present embodiment, the wire 42 and the wire 43 oppose the main surface 3B via the insulating layer 44. For example, when the wire 42 constitutes a second wire, the wire 43 constitutes a first wire.

As shown in FIG. 4 and FIG. 6, the wire 42 includes a plurality of branch wires 45 and a common wire 46. The plurality of branch wires 45 are provided for a plurality of cell groups (referred to hereinafter as "column direction cell groups"), each including a plurality of cells U aligned in a column direction, and in correspondence with each column direction cell group. In other words, the plurality of branch wires 45 are respectively provided for each of N column direction cell groups that each include M cells U aligned in the column direction. In the present embodiment, the column direction is the Y axis direction and a row direction, to be described below, is the X axis direction. For example, the plurality of column direction cell groups constitute N second cell groups.

Each branch wire 45 includes a common wire 45a and a plurality of connection wires 45b. The common wire 45a of each branch wire 45 is disposed along the direction in which the plurality of cells U, included in the column direction cell group positioned at the corresponding column, are aligned. The plurality of common wires 45a are provided substantially in parallel to each other. In other words, the plurality of common wires 45a are aligned along the row direction in correspondence with the respective column direction cell groups. The plurality of connection wires 45b electrically connect each common wire 45a and the semiconductor regions 33 of the respective avalanche photodiodes APD included in the corresponding column direction cell group.

When viewed in the X axis direction, the common wire 45a and each connection wire 45b intersect each other. The common wire 45a and the plurality of connection wires 45b are made of the same metal material and are made, for example, of aluminum. The common wire 45a and the plurality of connection wires 45b may be made of a metal material. For example, the metal material includes Cu (copper), Ti (titanium), Ni (nickel), Au (gold), or Pt (platinum). For example, the plurality of branch wires 45 constitute a plurality of second branch wires.

Each of the plurality of branch wires 45 is connected to the common wire 46. Specifically, the common wire 45a of each of the plurality of branch wires 45 is electrically connected to the common wire 46. For example, the common wire 46 intersects each common wire 45a when viewed in the Z axis direction. The common wire 46 is disposed, for example, in a region outside an incidence region, which, in the semiconductor substrate 3, is formed to include all of the plurality of cells U. The incidence region indicates, for example, a range in the semiconductor photodetection device 1 in which the light to be detected is incident. The common wire 46 is electrically connected to the bump electrode 41a. For example, the common wire 46 is made of the same metal material as the plurality of branch wires 45.

The wire 43 includes a plurality of branch wires 47 and a common wire 48. The plurality of branch wires 47 are provided for a plurality of cell groups (referred to hereinafter as "row direction cell groups"), each including a plurality of cells U aligned in a row direction, and in correspondence with each row direction cell group. In other words, the plurality of branch wires 47 are respectively provided for each of M row direction cell groups that each include N cells U aligned in the row direction. For example, the plurality of row direction cell groups constitute M first cell groups.

Each branch wire 47 includes a common wire 47a, a plurality of quenching resistors 47b, and a plurality of connection wires 47c. The common wire 47a of each branch wire 47 is disposed along the direction in which the plurality of cells U, included in the row direction cell group positioned at the corresponding row, are aligned. The plurality of common wires 47a are provided substantially in parallel to each other. In other words, the plurality of common wires 47a are aligned along the column direction in correspondence with each row direction cell group. The plurality of common wires 47a intersect the plurality of common wires 45a when viewed in the Z axis direction. Each of the plurality of common wires 47a is electrically connected to the semiconductor regions 31 of the respective avalanche photodiodes APD included in the row direction cell groups corresponding to each common wire 47a via the quenching resistors 47b and the connection wires 47c. When viewed in the Y axis direction, the common wire 47a and each connection wire 47c intersect each other. The common wire 47a and the connection wire 47c are made of the same metal material and are made, for example, of aluminum. The common wire 47a and the connection wire 47c may be made of a metal material. The metal material includes Cu (copper), Ti (titanium), Ni (nickel), Au (gold), or Pt (platinum). When viewed in the Z axis direction, the quenching resistor 47b is disposed to be oriented along peripheral edge of the semiconductor region 31. The quenching resistors 47b are made of a material of higher resistance value than the material forming the common wires 47a and the connection wires 47c and are made, for example, of SiCr (silicon chromium). The quenching resistors 47b may be made of polysilicon, NiCr (nickel chromium), or FeCr (ferrochrome). For example, the plurality of branch wires 47 constitute a plurality of first branch wires.

Each of the plurality of branch wires 47 is connected to the common wire 48. Specifically, the common wire 47a of each of the plurality of branch wires 47 is electrically connected to the common wire 48. The common wire 48 intersects each common wire 47a when viewed in the Z axis direction. For example, the common wire 48 and the common wire 46 of the wire 42 are disposed to intersect mutually when viewed in the Z axis direction. The common wire 48 is disposed, for example, in a region outside the incidence region in the semiconductor substrate 3. The common wire 48 is electrically connected to the bump electrode 41b. For example, the common wire 48 is made of the same metal material as the common wires 47a and the connection wires 47c.

The positions in the Z axis direction of the common wires 45a of the wire 42, the common wires 47a of the wire 43, and quenching resistors 47b of the wire 43 differ from each other. In the present embodiment, the common wires 47a, the quenching resistors 47b, and the common wires 45a are disposed in that order from the main surface 3B of the semiconductor substrate 3. Cross-sectional shapes of the common wires 45a, the common wires 47a, and the quenching resistors 47b in a plane orthogonal to the X axis direction or the Y axis direction are, for example, rectangular. Cross-sectional shapes of the connection wires 45b of the wire 42 and the connection wires 47c of the wire 43 in a plane orthogonal to the Z axis direction are, for example, rectangular. As an example, a thickness (length in the Z axis direction) of the common wire 45a is approximately 600 nm, a thickness of the common wire 47a is approximately 600 nm, and a thickness of the quenching resistor 47b is approximately 5 nm. As an example, a clearance in the Z axis direction between the common wire 45a and the quenching resistor 47b is approximately 300 nm, and a clearance in the Z axis direction between the common wire 47a and the quenching resistor 47b is approximately 300 nm. A clearance between the common wire 47a and the main surface 3B of the semiconductor substrate 3 is approximately 300 nm.

The insulating layer 44 covers the wire 42 and the wire 43. The insulating layer 44 is made of a material capable of securing insulation between the wire 42 and the wire 43 that are connected to mutually different potentials and is made, for example, of $SiO_2$ (silicon oxide). As an example, a thickness of the insulating layer 44 is approximately 2.5 μm. The insulating layer 44 may cover entireties of the wire 42 and the wire 43 with the exception of connection portions to the semiconductor substrate 3 and the circuit board 5. The insulating layer 44 may cover a portion of the wire 42 and a portion of the wire 43. In this case, the insulating layer 44 may cover the branch wires 45 of the wire 42 and the branch wires 47 of the wire 43.

The pn junction of each avalanche photodiode APD forms a light receiving region. In the present embodiment, the light receiving region is formed of the semiconductor region 31 and the semiconductor region 32. A contact resistance between the avalanche photodiode APD and the wire 42 is reduced by the wire 42 being electrically connected to the semiconductor region 32 via the semiconductor region 33 of higher impurity concentration than the semiconductor region 32. When viewed from a positive direction of the Z axis direction, the wire 42 (connection wire 45b) is electrically connected to one corner portion 33d of the semiconductor region 33 (see FIG. 6). The peripheral edge of the semiconductor region 31 includes a curved portion 31a at a position corresponding to the corner portion 33d. The curved portion 31a is formed to project out toward a center of each avalanche photodiode APD when viewed in the Z axis direction. A distance α between a portion of the corner portion 33d that is a connection portion with the connection wire 45b and the semiconductor region 31 (curved portion 31a) is greater than a distance β between the trench 34 and the semiconductor region 31. The distance a is the shortest distance between the connection portion, of the connection wire 45b and the semiconductor region 33, and the semiconductor region 31 when viewed in the Z axis direction. The distance β is the shortest distance between the trench 34 and the semiconductor region 31 when viewed in the Z axis direction.

To describe a photodetection operation in the semiconductor photodetection device 1, with the semiconductor photodetection device 1 of the present embodiment, the bias voltage (reverse bias voltage) is applied all at once to the avalanche photodiodes APD respectively included in the plurality of cells U via the wire 42. When incident light (photon) is incident on an avalanche photodiode APD to which the bias voltage is applied, photoelectric conversion is performed in an interior of the semiconductor substrate 3 and a photoelectron is generated. Avalanche multiplication is performed at a pn junction interface of the avalanche photodiode APD and the multiplied electron group flows into the circuit board 5 via the wire 43. By the electron group flowing into the circuit board 5, a signal (current signal) accompanying the incidence of light is output from the avalanche photodiode APD to the circuit board 5. In the present embodiment, by incident light being incident on an avalanche photodiode APD or avalanche photodiodes APD included in any one or plurality of cells U among the plurality of cells U that are arrayed two-dimensionally, the signal corresponding to the incident light is output to the circuit board 5. For example, at the circuit board 5, an incident light amount of the light is measured in accordance with the signal output from the avalanche photodiodes APD in the cells U.

Figure 7:
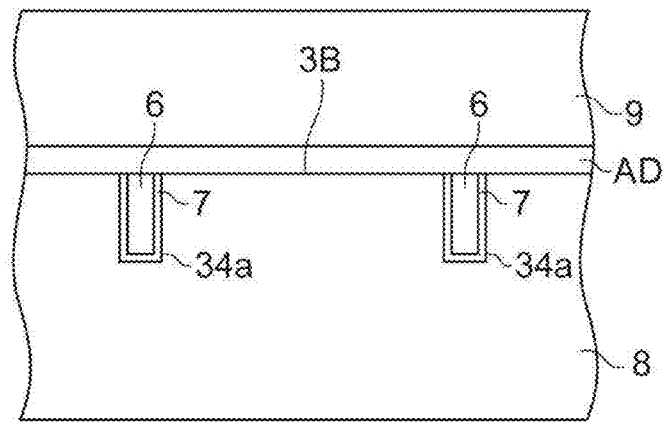
FIG. 7 is a diagram showing the manufacturing process of the semiconductor photodetection device shown in FIG. 1.
Figure 7:
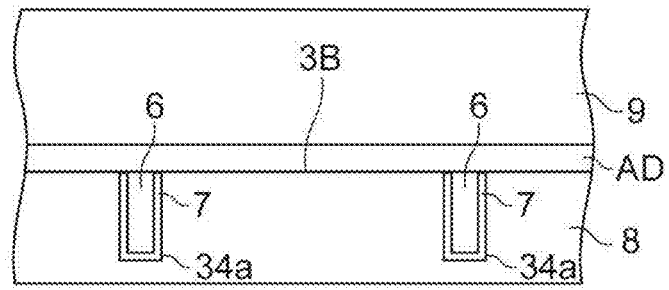
Figure 7:
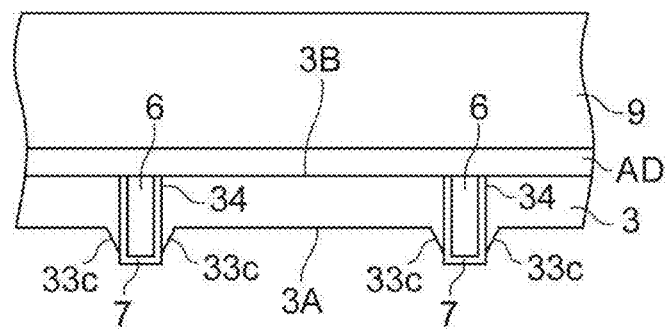
Figure 8:
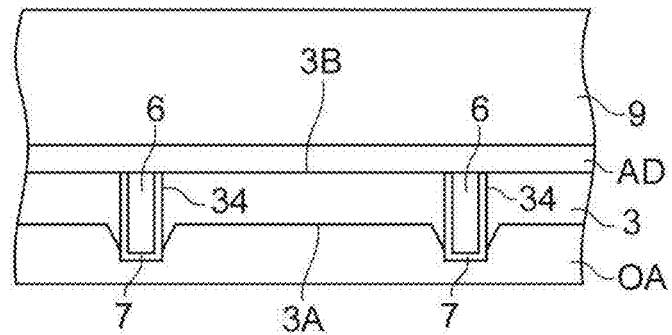
FIG. 8 is a diagram showing the manufacturing process of the semiconductor photodetection device shown in FIG. 1.
Figure 8:
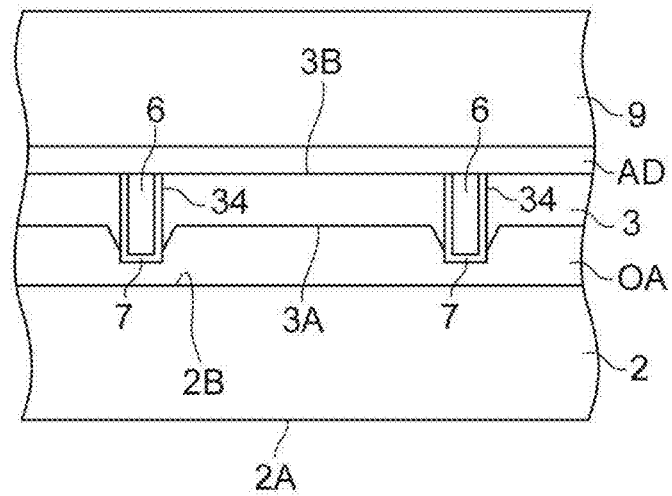
Figure 8:
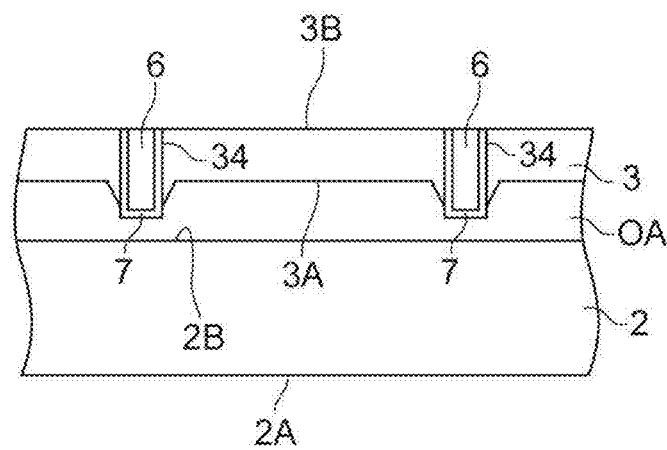
Figure 9:
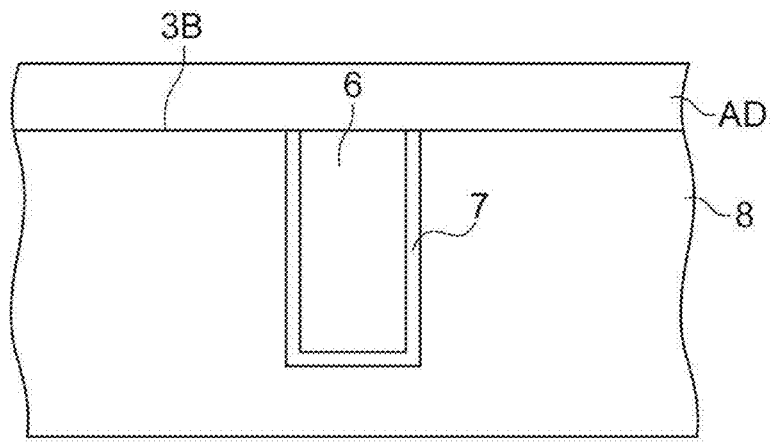
FIG. 9 is a diagram showing an etching process.
Figure 9:
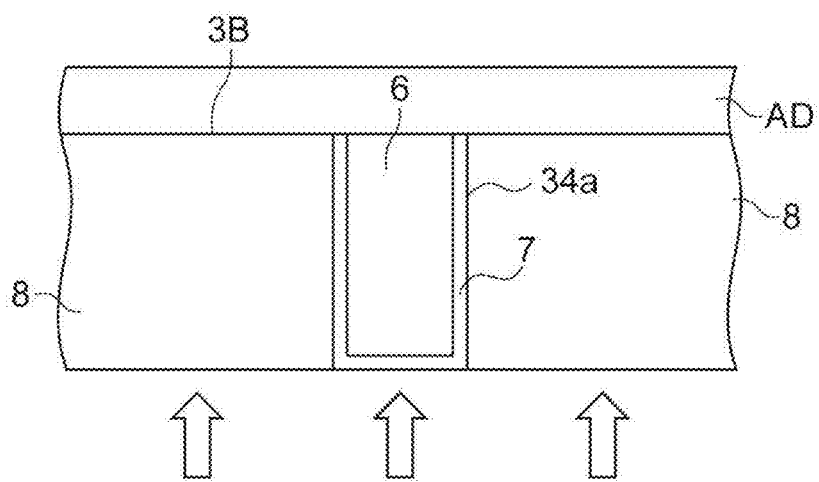
Figure 9:
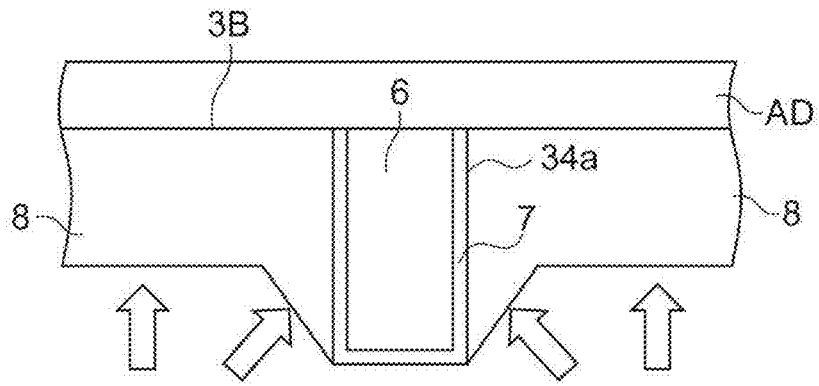

An example of a manufacturing process of the semiconductor photodetection device 1 according to the present embodiment will now be described with reference to FIG. 7, FIG. 8, and FIG. 9. FIGS. 7(a) to 7(c) and FIGS. 8(a) to 8(c) are diagrams showing the manufacturing process of the semiconductor photodetection device shown in FIG. 1. FIG. 9 is a diagram showing an etching process. In these drawings, cross-sectional shapes of the respective elements are shown and hatching is omitted.

The manufacturing process of the semiconductor photodetection device 1 shown in FIGS. 7(a) to 7(c) and FIGS. 8(a) to 8(c) includes a temporary bonding step, a polishing step, an etching step, a coating step, a main bonding step, and a peeling step. In the manufacturing process of the semiconductor photodetection device 1 of the present embodiment, the temporary bonding step, the polishing step, the etching step, the coating step, the main bonding step, and the peeling step are performed in that order.

In the temporary bonding step shown in FIG. 7(a), first, an Si (silicon) substrate 8 that is to be a base material of the semiconductor substrate 3 is prepared. In one of the main surfaces of the prepared Si substrate 8, a trench 34a is formed to surround regions in which the respective cells U (the respective avalanche photodiodes APD) are to be formed. The main surface of the Si substrate 8 in which the trench 34a is formed corresponds to the main surface 3B of the semiconductor substrate 3 and hereinafter, this main surface of the Si substrate 8 will also be referred to as the "main surface 3B". The Si substrate 8 is a substrate that is thicker than the semiconductor substrate 3 included in the semiconductor photodetection device 1 that is manufactured. A depth (length) of the trench 34a is longer than the length of the trench 34 formed in the semiconductor substrate 3. An area of the trench 34a when viewed in a direction orthogonal to the main surface 3B is the same as an area of the trench 34. The respective semiconductor regions constituting the respective avalanche photodiodes APD are formed, for example, by doping the Si substrate 8, in which the trench 34a is formed, with a p-type impurity and an n-type impurity. As an example, a Group 13 element (for example, B) is used as the p-type impurity and a Group 15 element (for example, P or As) is used as the n-type impurity. As an impurity doping method, for example, a diffusion method or an ion implantation method is used. For example, the trench 34a may be formed after the respective semiconductor regions constituting the respective avalanche photodiodes APD are formed in the Si substrate 8.

Subsequently, the light-shielding member 6 covered by the insulating film 7 is formed inside the trench 34a. In other words, an interior of a region demarcated by a virtual surface that is flush with the main surface 3B and the trench 34a is filled with the light-shielding member 6 and the insulating film 7. In the present embodiment, the light-shielding member 6 that is covered by the insulating film 7 is disposed inside the trench 34a such that one side surface of the light-shielding member 6 that is not covered by the insulating film 7 is exposed from the main surface 3B. A temporary holding substrate 9 is then prepared and the temporary holding substrate 9 is adhered onto the main surface 3B of the Si substrate by an adhesive AD that changes in tack strength with temperature. The temporary holding substrate 9 is used in the manufacturing process of the semiconductor photodetection device 1. The temporary holding substrate 9 is, for example, a glass substrate. For example, the adhesive AD has an adhesive strength that maintains an adhered state of the temporary holding substrate 9 and the Si substrate 8 at ordinary temperature, and the adhered state of the Si substrate 8 and the temporary holding substrate 9 is released by the adhesive AD being heated. For example, the adhesive AD may have an adhesive strength that maintains the adhered state of the temporary holding substrate 9 and the Si substrate 8 regardless of temperature. In this case, the adhered state of the Si substrate 8 and the temporary holding substrate 9 may be released by irradiating the adhesive AD with light (for example, laser light).

Subsequently, in the polishing step shown in FIG. 7(b), a main surface of the Si substrate 8 opposite the main surface 3B is polished. In the polishing step, the Si substrate 8 is polished such that a thickness of the Si substrate 8 becomes a length obtained by adding a predetermined distance to the depth of the trench 34a. For example, the thickness of the polished Si substrate 8 is approximately half the thickness of the Si substrate 8 prepared in the temporary bonding step.

Subsequently, in the etching step shown in FIG. 7(c), the main surface of the Si substrate 8 opposite the main surface 3B is etched to make the thickness of the Si substrate 8 even thinner and form the main surface 3A of the semiconductor substrate 3. In the etching step, the main surface of the Si substrate 8 opposite the main surface 3B is eroded by an etching liquid (etchant) such that the thickness of the Si substrate becomes smaller than the depth of the trench 34a. A thickness of the semiconductor substrate 3 (length between the main surface 3A and the main surface 3B) is defined by the thickness of the etched Si substrate 8, a portion of the trench 34a becomes non-existent, and the trench 34 having the same length as that between the main surface 3A and the main surface 3B is formed.

The process in which the main surface 3A is formed by the etching step is shown in FIG. 9(a) to FIG. 9(c). In FIG. 9(a) to FIG. 9(c), illustration of the temporary holding substrate 9 is omitted. An intermediate shown in FIG. 9(a) is the intermediate after polishing of the Si substrate 8 that is shown in FIG. 7(b) and this intermediate is immersed in a caustic agent or other etching liquid. After immersion in the etching liquid, etching progresses at substantially the same rate across an entirety of the main surface of the Si substrate 8 opposite the main surface 3B. The thickness of the Si substrate 8 changes substantially uniformly until the thickness of the Si substrate 8 becomes substantially the same as the depth of the trench 34a (total value of the length of the light-shielding member 6 and the thickness of the insulating film 7) as shown in FIG. 9(b). In the state shown in FIG. 9(b), the insulating film 7 covering the light-shielding member 6 is exposed to the etching liquid and even if etching progresses from this state, the insulating film 7 is not etched (eroded). In other words, the light-shielding member 6 and the insulating film 7 are maintained in the prepared shapes.

When the insulating film 7 is exposed to the etching liquid as shown in FIG. 9(c), plane orientations in which the Si substrate 8 is etched differ from that in the state shown in FIG. 9(b) and etching progresses in the different plane orientations. Specifically, etching progresses at a plane orientation, in which etching progresses in a thickness direction of the Si substrate 8, and plane orientations, in which etching progresses toward a center of the light-shielding member 6 (trench 34a) covered by the insulating film 7. With the plane orientations directed toward the center of the light-shielding member 6, the rate (etching rate) at which etching progresses is slow in comparison to that of the other plane orientation. The main surface 3A of the semiconductor substrate 3 formed at the point of end of etching includes the tapered surface 33c (see FIG. 7(c)).

Subsequently, in the coating step shown in FIG. 8(a), the optical adhesive OA is coated onto the main surface 3A of the semiconductor substrate 3. In the coating step, the optical adhesive OA is coated to cover an entirety of the surface of the insulating film 7 projecting out from the trench 34. Subsequently, the main bonding step, in which the glass substrate 2 is adhered onto the main surface 3A of the semiconductor substrate 3 via the optical adhesive OA, is performed as shown in FIG. 8(b). The glass substrate 2 that is adhered in the main bonding step is a member that is included even after manufacture of the semiconductor photodetection device 1. The optical adhesive OA differs from the adhesive AD used in the temporary bonding step.

Subsequently, in the peeling step shown in FIG. 8(c), the temporary holding substrate 9 is peeled from the main surface 3B of the semiconductor substrate 3. For example, the temporary holding substrate 9 and the adhesive AD are removed by a machine or a worker after the adhesive AD is heated. The trench 34 is thus formed in the semiconductor substrate 3 and the light-shielding member 6 and the insulating film 7 are disposed in the trench 34.

In a process of avalanche multiplication, an avalanche photodiode APD may generate a secondary light different from the incident light. When the secondary light is incident on an adjacent cell U, the avalanche photodiode APD included in the adjacent cell U may perform avalanche multiplication of a carrier generated by the incident secondary light. There is thus a possibility of occurrence of a phenomenon in which the secondary light is incident on the avalanche photodiode APD in adjacent cell U, that is, there is a possibility of occurrence of optical crosstalk.

With the semiconductor photodetection device 1 of the present embodiment, the trench 34, surrounding each of the plurality of avalanche photodiodes APD when viewed in the Z axis direction, is formed in the semiconductor substrate 3, and the light-shielding member 6, including the portion 6a, positioned inside the trench 34, and the portion 6b, projecting out from main surface 3A, is included. A configuration, where the light-shielding member 6 includes the portion 6b projecting out from a main surface, prevents secondary light from being incident on an avalanche photodiode APD in an adjacent cell U even more reliably in comparison to a configuration where a light-shielding member does not include a portion that projects out. The light-shielding member 6 thus reduces optical crosstalk reliably.

The portion 6b of the light-shielding member 6 is less likely to be protected by the semiconductor substrate 3 than the portion 6a of the light-shielding member 6 that is positioned inside the semiconductor substrate 3 (trench 34). The portion 6b may thus be exposed to an atmospheric environment outside the semiconductor substrate 3. In this case, the light-shielding member 6, including the portion 6b, may corrode. If the light-shielding member 6 corrodes, the light-shielding member 6 is unlikely to reduce optical crosstalk.

With the semiconductor photodetection device 1, the insulating film 7 includes a portion that covers the surface of the portion 6b of the light-shielding member 6 that projects out from the main surface 3A of the semiconductor substrate 3. Even if the portion 6b of the light-shielding member 6 projects out from the main surface 3A, it is unlikely to be exposed to the atmospheric environment outside the semiconductor substrate 3. The light-shielding member 6 is thus unlikely to corrode and the light-shielding member 6 reduces optical crosstalk reliably.

The light-shielding member 6 is made of a material that reflects light. By this configuration, light, which, among the light incident on the semiconductor photodetection device 1, is incident toward the light-shielding member 6, is reflected by the light-shielding member 6. A portion of the light that is incident toward the light-shielding member 6 may thus be reflected toward the pn junction formed in an avalanche photodiode APD. Therefore, with the present configuration, an amount of photoelectrons generated in the avalanche photodiodes APD may increase in comparison to a case where the light-shielding member 6 is made of a material that absorbs light. Consequently, detection sensitivity of the incident light at the semiconductor photodetection device 1 may be improved.

The main surface 3A includes the tapered surface 33c. By this configuration, a portion of light, which, among the light incident on the semiconductor photodetection device 1, is directed toward the tapered surface 33c, may be reflected by the tapered surface 33c toward the pn junction of an avalanche photodiode APD. Therefore, with the present configuration, the amount of photoelectrons generated in the avalanche photodiodes APD may increase in comparison to a case where an entire surface of the main surface 3A in each avalanche photodiode APD is flat. Consequently, the detection sensitivity of the incident light at the semiconductor photodetection device 1 may be improved.

The insulating film 7 includes a portion that contacts the side surfaces of the trench 34 and covers the portion 6a of the light-shielding member 6. The portion covering the portion 6b and the portion covering the portion 6a are formed integrally. With the present configuration, the portion of the insulating film 7 covering the portion 6a secures electrical insulation between the semiconductor substrate 3 and the light-shielding member 6. The light-shielding member 6 is covered reliably and durability of the light-shielding member 6 is improved because the portion covering the portion 6a and the portion covering the portion 6b are formed integrally. Therefore with the present configuration, optical crosstalk is reduced even more reliably in comparison to a configuration where the portion covering the portion 6a and the portion covering the portion 6b are formed as separate bodies.

The portion 6b of the light-shielding member 6 and the portion of the insulating film 7 covering the portion 6b are positioned inside the optical adhesive OA. With the present configuration, the portion 6b of the light-shielding member 6 projecting out from the main surface 3A of the semiconductor substrate 3 is held by the optical adhesive OA and a force of holding the light-shielding member 6 is thus improved, for example, in comparison to a case where the portion of the insulating film 7 covering the portion 6b is exposed to the exterior of the semiconductor substrate 3.

The plurality of branch wires 45 are respectively provided for each column direction cell group and the plurality of branch wires 47 are respectively provided for each row direction cell group. Therefore, in a case where each of the plurality of avalanche photodiodes APD is to be connected to common potentials via each of the wire 42 and the wire 43, the present configuration simplifies the wires 42 and 43 electrically connected to the avalanche photodiode APD included in each cell U in comparison to a case where a single wire is provided for each cell U.

Each branch wire 45 (connection wires 45b) is connected to the semiconductor regions 33 of the avalanche photodiodes APD included in the corresponding cells U among the plurality of cells U. The shortest distance between the connection portion, of the connection wire 45b and the semiconductor region 33, and the semiconductor region 31 is greater than the shortest distance between the semiconductor region 31 and the trench 34. With the present configuration, in comparison to a configuration where the shortest distance between the abovementioned connection portion and the semiconductor region 31 is not more than the shortest distance between the semiconductor region 31 and the trench 34, the branch wire 45 and the semiconductor region 31 are unlikely to become short-circuited even when the bias voltage is applied to the avalanche photodiode APD. The present configuration thus improves a withstand voltage between the branch wire 45 and the semiconductor region 31.

For example, as a configuration of wires connected to a semiconductor substrate, a configuration as in the semiconductor photodetection device described in Patent Document 1 mentioned above may be considered. With this configuration, a wire (hereinafter referred to as the "anode wire") applying a bias voltage is disposed on one main surface of a semiconductor substrate and a wire (hereinafter referred to as the "cathode wire") outputting a signal is disposed on another main surface of the semiconductor substrate. To make an avalanche photodiode operate in the Geiger mode, a bias voltage that is not less than the breakdown voltage must be applied and thus a comparatively high voltage is applied to the avalanche photodiode via the anode wire.

If mutually adjacent cells are not completely separated from each other, the anode wire does not need to be physically connected to each cell and therefore a degree of freedom of configuration of the anode wire increases. It therefore becomes possible to arrange the wires such as to secure a distance between a connection portion (for example, a portion of a semiconductor region of p-type conductivity) of the avalanche photodiode at which the anode wire is connected and a semiconductor region (for example, a semiconductor region of n-type conductivity) at which the cathode wire is electrically connected and prevent occurrence of dielectric breakdown therebetween. However, if mutually adjacent cells are completely separated from each other, the anode wire and the cathode wire must be physically and electrically connected to each cell. A region of one cell is small and therefore if the anode wire and the cathode wire are disposed on one main surface, there is concern for occurrence of the abovementioned dielectric breakdown. Therefore generally, the anode wire and the cathode wire are respectively disposed at different main surfaces as described in Patent Document 1.

On the other hand, with the semiconductor photodetection device 1 according to the present embodiment, both the wire 42, applying the bias voltage to the avalanche photodiode APD in the respective cells U, and the wire 43, outputting the signals from the avalanche photodiode APD in the respective cells U, are provided on the main surface 3B, which is one of the main surfaces of the semiconductor substrate 3. By both the wire 42 and the wire 43 being provided on the main surface 3B, the semiconductor photodetection device 1 is made a configuration that is suitable for practical use. For example, because the wires are arranged on one main surface of the semiconductor substrate 3, the semiconductor substrate 3 and the circuit board 5 are electrically connected by providing electrodes or wires (for example, bump electrodes) for connection with the circuit board 5 on the one main surface of the semiconductor substrate 3. The configuration of the wires, including the electrodes, etc., that are electrically connected from the semiconductor substrate 3 to the circuit board 5 is thereby simplified.

Figure 10:
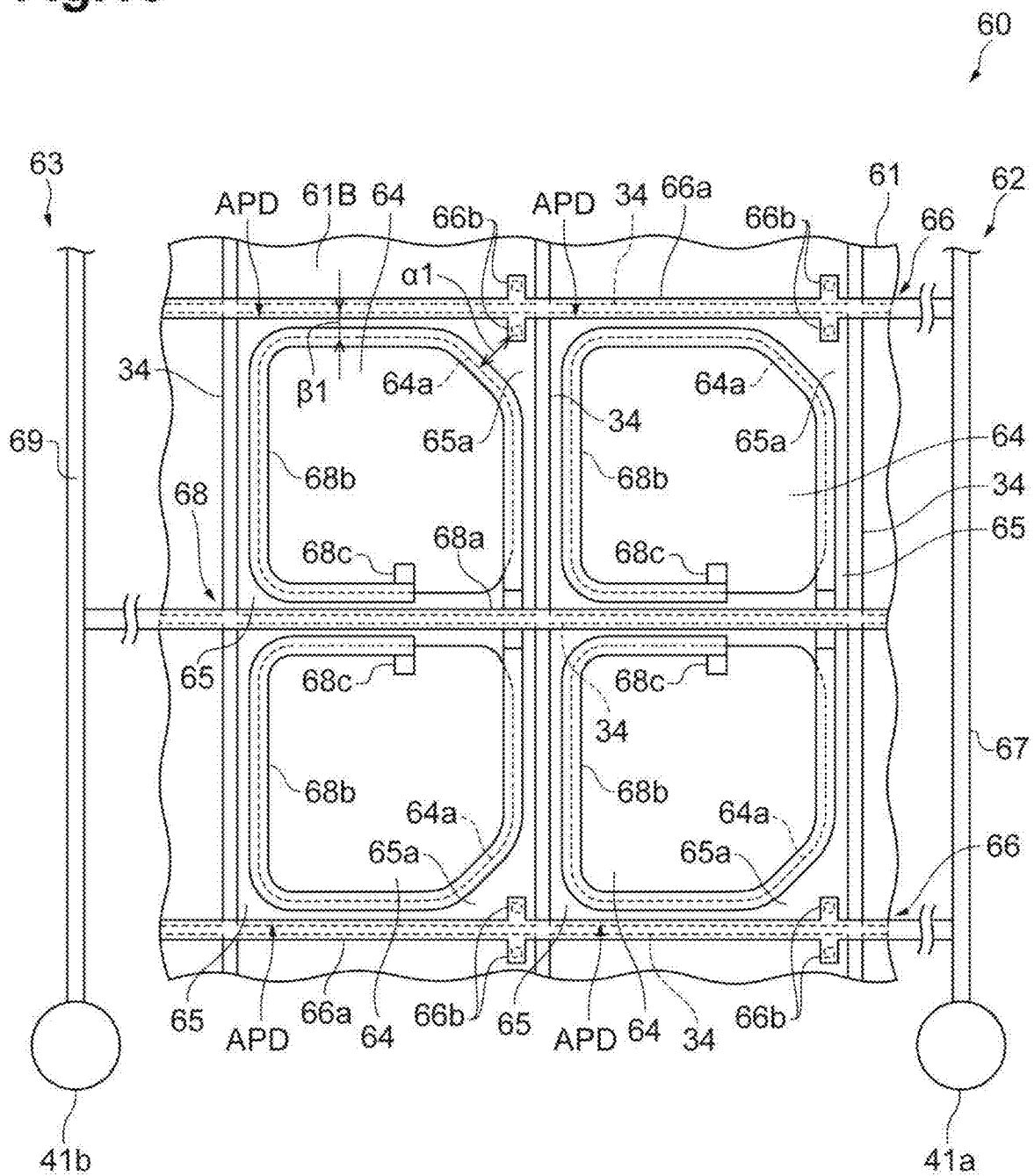
FIG. 10 is a plan view showing a semiconductor photodetection device according to a second embodiment.

A semiconductor photodetection device 60 according to a second embodiment will now be described with reference to FIG. 10. FIG. 10 is a plan view showing the semiconductor photodetection device according to the second embodiment. The semiconductor photodetection device 60 shown in FIG. 10 differs from the semiconductor photodetection device 1 shown in FIG. 1 in the point of including a semiconductor substrate 61 in place of the semiconductor substrate 3 and in the point of including wires 62 and 63 in place of the wires 42 and 43. In FIG. 10, illustration of an insulating layer covering each of the wire 62 and the wire 63 is omitted.

The semiconductor substrate 61 includes a plurality of cells U that are arrayed two-dimensionally in M rows and N columns. As shown in FIG. 10, each of the plurality of cells U includes one avalanche photodiode APD. Each of the plurality of cells U may include a plurality of avalanche photodiodes APD. The semiconductor substrate 61 has a main surface 61B and a main surface opposing the main surface 61B. The avalanche photodiode APD of each of the plurality of cells U includes an n-type conductivity semiconductor region 64, and a p-type conductivity semiconductor region 65. Although unillustrated, in a sectional configuration of the semiconductor substrate 61, the semiconductor region 65 surrounds the semiconductor region 64. In each avalanche photodiode APD, the semiconductor region 64 and the semiconductor region 65 form the main surface 61B of the semiconductor substrate 61. In the semiconductor substrate 61, the trench 34 is formed to surround the respective cells U (the respective avalanche photodiodes APD) when viewed in the Z axis direction. The light-shielding member 6, covered by the insulating film 7, is provided inside the trench 34. In FIG. 10, illustration of the light-shielding member 6 and the insulating film 7 is omitted. As in the semiconductor photodetection device 1, the light-shielding member 6, covered by the insulating film 7, projects out from the main surface opposing the main surface 61B. The surface of the portion of the light-shielding member 6 projecting out from the main surface opposing the main surface 61B is covered by the insulating film 7. For example, when the semiconductor region 64 constitutes the first semiconductor region, the semiconductor region 65 constitutes the second semiconductor region.

As shown in FIG. 10, the wire 62 includes a plurality of branch wires 66 and a common wire 67. The wire 63 includes a plurality of branch wires 68 and a common wire 69. In FIG. 10, a single branch wire 68 among the plurality of branch wires 68 is shown. Each of the plurality of branch wires 66 and each of the plurality of branch wires 68 are disposed alternately in the Y axis direction. In the present embodiment, the plurality of branch wires 66 are respectively provided for every two mutually adjacent row direction cell groups, and the plurality of branch wires 68 are respectively provided for every two mutually adjacent row direction cell groups. The two row direction cell groups with which each branch wire 66 corresponds is shifted by one row with respect to the two row direction cell groups with which each branch wire 68 corresponds. For example, the respective branch wires 68 are respectively provided for every row direction groups of the (2×m−1)th row and the (2×m)th row, and the respective branch wires 66 are respectively provided for every row direction groups of the (2×m)th row and the (2×m+1)th row. Here, n is an integer not less than 1. The respective branch wires 68 may be respectively provided for every row direction groups of the (2×m)th row and the (2×m+1)th row, and the respective branch wires 66 may be respectively provided for with every row direction groups of the (2×m−1)th row and (2×m)th row. For example, when the wire 62 constitutes the second wire, the wire 63 constitutes the first wire. For example, when the branch wires 66 constitute the second branch wires, the branch wires 68 constitute the first branch wires.

Each branch wire 66 includes a common wire 66a and a plurality of connection wires 66b. The common wire 66a of each branch wire 66 is disposed between the corresponding two row direction cell groups (above the trench 34) when viewed in the Z axis direction. The plurality of connection wires 66b of each branch wire 66 electrically connect the semiconductor regions 65 of the avalanche photodiodes APD, included in the two row direction cell groups corresponding to the branch wire 66, and the common wire 66a. For example, the bias voltage is applied to the avalanche photodiodes APD in the (2×N) cells U included in two mutually adjacent row direction cell groups via one branch wire 66. The branch wire 66 (common wire 66a and connection wires 66b) is made, for example, of the same metal material as the common wire 45a. Each of the plurality of branch wires 66 is electrically connected to the common wire 67. A wire that is electrically connected to the row direction cell group of just the first row may be connected to the common wire 67. A wire that is electrically connected to the row direction cell group of just the M-th row may be connected to the common wire 67. The common wire 67 is electrically connected to the bump electrode 41a. The common wire 67 is, for example, made of the same metal material as the common wire 46.

Each branch wire 68 includes a common wire 68a, a plurality of quenching resistors 68b, and a plurality of connection wires 68c. The common wire 68a of each branch wire 68 is disposed between the corresponding two row direction cell groups (above the trench 34) when viewed in the Z axis direction. The quenching resistor 68b of each branch wire 68 is electrically connected to the common wire 68a and is disposed along a peripheral edge of the semiconductor region 64. The connection wire 68c electrically connects the quenching resistor 68b and the semiconductor region 64 of the avalanche photodiode APD. In other words, the common wire 68a is electrically connected to the semiconductor region 64 of the avalanche photodiode APD via the quenching resistor 68b and the connection wire 68c. For example, signals from the avalanche photodiodes APD included in two mutually adjacent row direction cell groups are output via one branch wire 68. The common wire 68a and the connection wires 68c are made, for example, of the same metal material as the common wire 47a. The quenching resistors 68b are made, for example, of the same material as the quenching resistors 47b. Each of the plurality of branch wires 68 is electrically connected to the common wire 69. The common wire 69 is electrically connected to the bump electrode 41b. A wire that is electrically connected to the row direction cell group ofjust the first row may be connected to the common wire 69. A wire that is electrically connected to the row direction cell group of just the M-th row may be connected to the common wire 69.

With the present embodiment, the common wires 66a and the common wires 68a are disposed substantially parallel to each other. When viewed in the Z axis direction, each common wire 66a and the common wire 67 intersect each other and each common wire 68a and the common wire 69 intersect each other. The common wire 67 and the common wire 69 are disposed substantially parallel to each other. For example, positions in the Z axis direction of the common wires 66a and the common wires 68a are substantially the same as each other.

Each semiconductor region 65 has a rectangular frame shape when viewed in the Z axis direction. The connection wire 66b is connected in a corner portion 65a of the semiconductor region 65. A peripheral edge of each semiconductor region 64 includes an inclined portion 64a that is inclined with respect to the X axis direction and the Y axis direction when viewed in the Z axis direction. A distance al between a connection portion of the connection wire 66b in the corner portion 65a and the semiconductor region 64 (inclined portion 64a) may be greater than a distance β1 between the trench 34 and the semiconductor region 64. The distance al is the shortest distance between the connection portion, of the connection wire 66b and the semiconductor region 65, and the semiconductor region 64 when viewed in the Z axis direction. The distance β1 is the shortest distance between the trench 34 and the semiconductor region 64 when viewed in the Z axis direction.

As in the semiconductor photodetection device 1, the light-shielding member 6 is unlikely to corrode and the light-shielding member 6 reduces optical crosstalk reliably in the semiconductor photodetection device 60 as well.

With the semiconductor photodetection device 60, the branch wires 66 and the branch wires 68 are provided alternately according to each row. Therefore, for example, in a case where each of the plurality of cells U is to be connected to common potentials via each of the wire 62 and the wire 63, the number of wires on the main surface 61B is lessened in comparison to a case where wires are provided individually for each cell U. The present configuration thus simplifies the configuration of the wire 62 and the wire 63 electrically connected to the avalanche photodiode APD included in each cell U.

Figure 11:
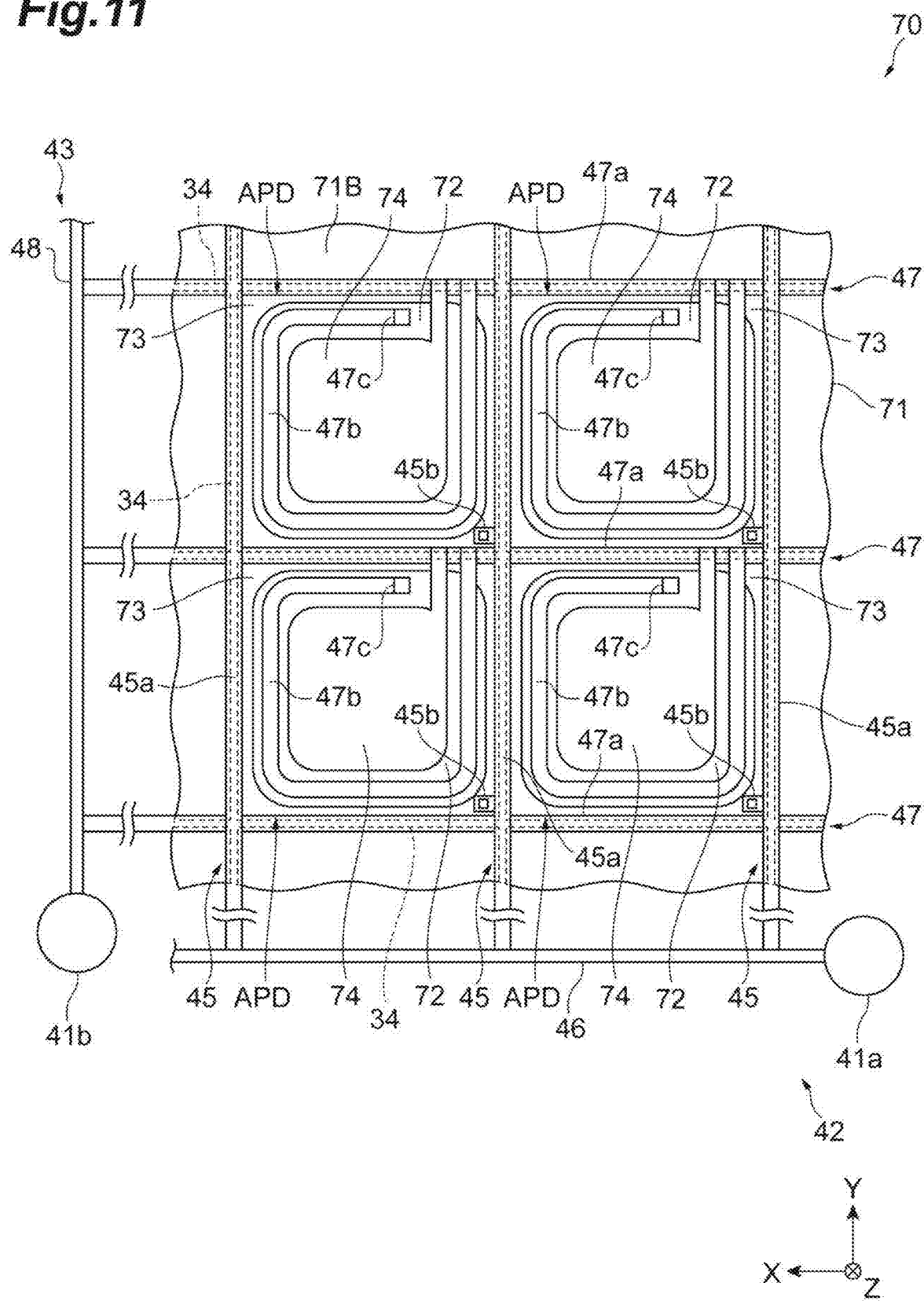
FIG. 11 is a plan view showing a semiconductor photodetection device according to a third embodiment.
Figure 12:
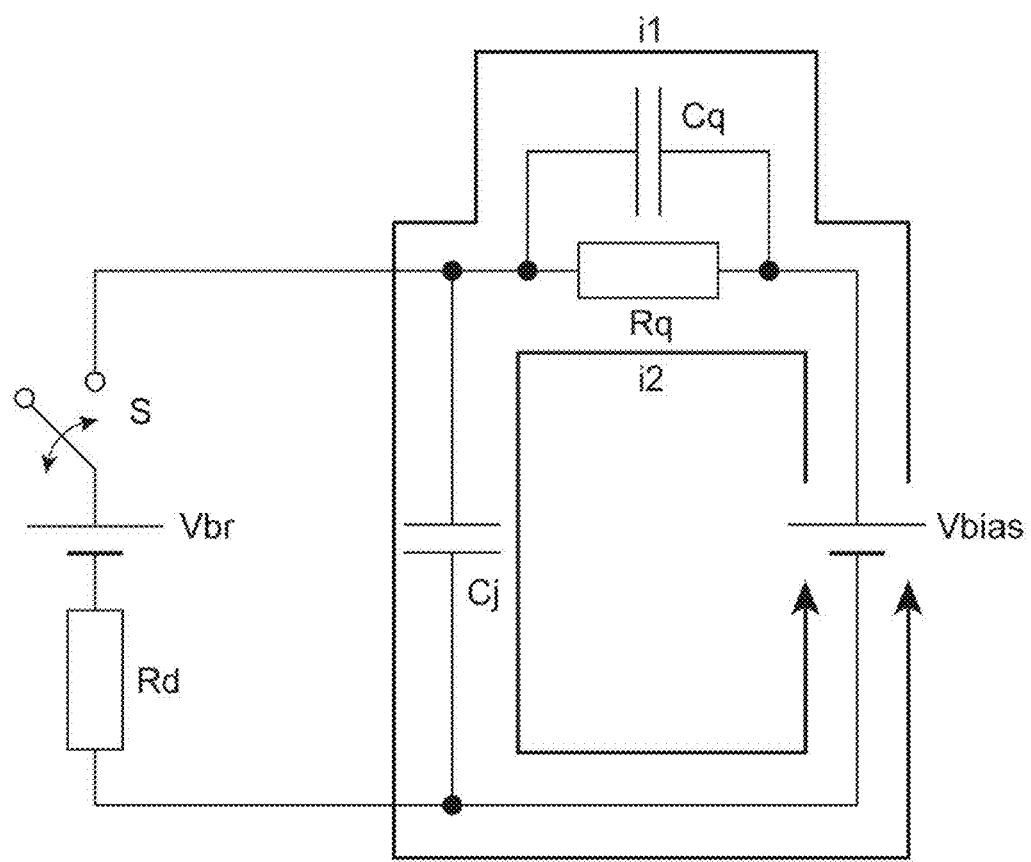
FIG. 12 is a diagram showing an equivalent circuit of an avalanche photodiode.
Figure 13:
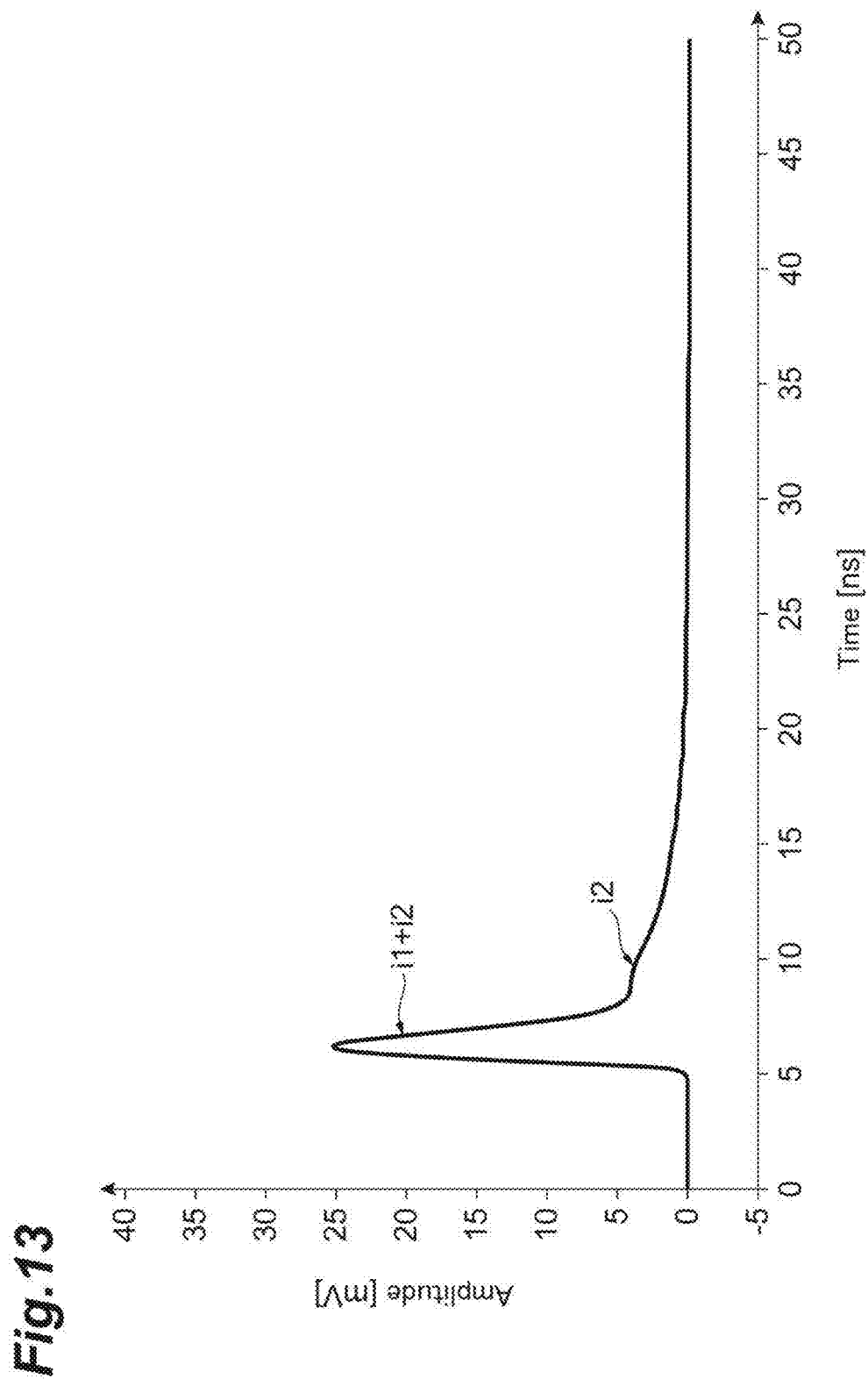
FIG. 13 is a diagram showing an example of a signal output from the avalanche photodiode.

A semiconductor photodetection device 70 according to a third embodiment will now be described with reference to FIG. 11 to FIG. 13. FIG. 11 is a plan view showing the semiconductor photodetection device according to the third embodiment. FIG. 12 is a diagram showing an equivalent circuit of an avalanche photodiode. FIG. 13 is a diagram showing an example of a signal output from the avalanche photodiode.

A semiconductor substrate 71 has an semiconductor region 72 of n-type conductivity and a semiconductor region 73 of p-type conductivity. The semiconductor substrate 71 is formed in the same manner as the semiconductor substrate 61 with the exception that a peripheral edge of the semiconductor region 72 does not include an inclined portion and detailed description of the respective semiconductor regions will thus be omitted. In the semiconductor substrate 71, the trench 34 is formed to surround the respective cells U (the respective avalanche photodiodes APD) when viewed in the Z axis direction. The light-shielding member 6, covered by the insulating film 7, is provided inside the trench 34. In FIG. 11, illustration of the light-shielding member 6 and the insulating film 7 is omitted. As in the semiconductor photodetection device 1, the light-shielding member 6, covered by the insulating film 7, projects out from the main surface opposing a main surface 71B. The surface of the portion of the light-shielding member 6 projecting out from the main surface opposing the main surface 71B is covered by the insulating film 7. For example, when the semiconductor region 72 constitutes the first semiconductor region, the semiconductor region 73 constitutes the second semiconductor region.

A capacitance increasing portion 74 is electrically connected to each common wire 47a. With the exception of a connection portion with the common wire 47a, the capacitance increasing portion 74 is positioned at an inner side of the quenching resistor 47b when viewed in the Z axis direction. A portion of the capacitance increasing portion 74 positioned at the inner side of the quenching resistor 47b is in a plate shape spreading in the XY axis plane and has a rectangular shape when viewed in the Z axis direction. The capacitance increasing portion 74 opposes the semiconductor region 72 of the avalanche photodiode APD. When viewed in the Z axis direction, a size (area) of the capacitance increasing portion 74 is smaller than the semiconductor region 72, and the capacitance increasing portion 74 has, for example, an area of not less than half the semiconductor region 72. The capacitance increasing portion 74 is made, for example, of a metal material. The capacitance increasing portion 74 is made, for example, of aluminum. The metal material forming the capacitance increasing portion 74 may include Cu (copper), Ti (titanium), Ni (nickel), Au (gold), or Pt (platinum).

The equivalent circuit arranged to reproduce a waveform of a signal output via the wire 43 (quenching resistor 47b) from an avalanche photodiode APD is shown in FIG. 12. A voltage Vbr indicates the breakdown voltage of the avalanche photodiode APD. A voltage Vbias indicates the voltage (bias voltage) applied to the avalanche photodiode APD. A resistor Rq indicates the quenching resistor. A resistor Rd indicates a serial resistance component that the semiconductor region of the avalanche photodiode APD has. A capacitor Cj indicates a static capacitance component that the semiconductor region of the avalanche photodiode APD has. A capacitor Cq indicates an effective static capacitance component present between the quenching resistor and the avalanche photodiode APD.

A signal (current i1), which is in accordance with high frequency components of photoelectrons (carriers) generated by incidence of incident light on the avalanche photodiode APD in the state where the bias voltage is applied, is output not via the resistor Rq (quenching resistor) but via the capacitor Cq. A time constant, which indicates a response speed of a signal (current i2) output via the resistor Rq, is large in comparison to the signal in accordance with the high frequency components that is output via the capacitor Cq. In FIG. 13, the waveform of the signal from the avalanche photodiode APD that is in accordance with the incident light is indicated as a change with time of a voltage value. In a vicinity of a time of 5 ns (nanoseconds), a signal obtained by synthesizing the signal output via the resistor Rq and the signal output via the capacitor Cq is observed, and in a vicinity of a time of 10 ns, the signal output via the resistor Rq is observed. With the semiconductor photodetection device 70, by the capacitance increasing portion 74 being provided, the capacitance of the capacitor Cq is large in comparison to a case where the capacitance increasing portion 74 is not provided. An amplitude (for example, a current value or a voltage value) of the signal output via the capacitor Cq is thus comparatively large. Consequently, a signal having a high output value at an initial stage is obtained when incident light is incident on the semiconductor photodetection device 70.

As in the semiconductor photodetection device 1, the light-shielding member 6 is unlikely to corrode and the light-shielding member 6 reduces optical crosstalk reliably in the semiconductor photodetection device 70 as well.

Although embodiments and modification examples of the present invention were described above, the present invention is not necessarily restricted to the embodiments and the modification examples described above, and various modifications are possible within a range not falling outside the gist thereof.

For example, the main surface 3B, on which the wires 42 and 43 are provided, may be the light incidence surface. In this case, a holding substrate that holds the semiconductor substrate 3 in place of the glass substrate 2 and the circuit board 5 may be provided. The semiconductor substrate 3 may be provided on the holding substrate such that the main surface 3A is opposed on the holding substrate. The holding substrate may be made of a material that does not transmit light. The wiring layer 4 does not have to include the insulating layer 44. The insulating layer 44 may be made of a material that transmits light.

In the semiconductor photodetection device 1, the bias voltage may be applied individually to each of the plurality of cells U. In other words, the bias voltage may be applied, according to each cell U, to the avalanche photodiode APD included in the cell U. In this case the bias voltage may be applied to just specific cells U among the plurality of cells U arrayed in a matrix. A wire that applies the bias voltage may be provided individually for each of the plurality of cells U. The wire 42 or 62 does not have to include the common wire 46 or 67. In this case, the bias voltage may be applied, according to every single column direction cell group or every two row direction cell groups via the respective branch wires 45 or 66, to the cells U included in the cell group or groups. For example, in a case where the bias voltage is applied according to every single column direction group via the wire 42, the bias voltage may be applied at timings that differ according to each cell group.

In the semiconductor photodetection device 1, the output from each of the plurality of cells U may be output individually to the circuit board 5. In other words, the output of the avalanche photodiode APD included in each cell U may be read according to each cell U. In this case, layout positions of the respective avalanche photodiodes APD and the outputs from the avalanche photodiodes APD may be associated with each other in the circuit board 5. A wire that reads out the signal may be provided individually for each of the plurality of cells U. The wire 43 or 63 does not have to include the common wire 48 or 69. In this case, the signal may be read out, according to every single or two row direction cell group or groups via the respective branch wires 47 or 68, from the cells U included in the cell group or groups.

Although one layer structure of the avalanche photodiodes APD is indicated in the embodiments and modification examples described above, the layer structure of the avalanche photodiode APD is not restricted thereto. For example, the conductivity type of the semiconductor region 31 may be p-type and the conductivity type of the semiconductor region 32 and the semiconductor region 33 may be n-type. For example, the conductivity type of the semiconductor region 64 or 72 may be p-type and the conductivity type of the semiconductor region 65 or 73 may be n-type. For example, the semiconductor region 31, 64, or 72 may be constituted of a plurality of semiconductor regions differing mutually in impurity concentration. A wire applying the bias voltage may be electrically connected to the semiconductor region 31, 64, or 72, and a wire reading out the signal from the avalanche photodiode APD may be electrically connected to the semiconductor region 32, 33, 65, or 73.

In the insulating film 7, the portion covering the portion 6a of the light-shielding member 6 and the portion covering the portion 6b of the light-shielding member 6 may be formed as separate bodies. On the other hand, if the portion covering the portion 6a of the light-shielding member 6 and the portion covering the portion 6b of the light-shielding member 6 are formed integrally, optical crosstalk is reduced even more reliably as mentioned above. The insulating film 7 does not to have to cover the light-shielding member 6 directly. In other words, the insulating film 7 may cover the light-shielding member 6 indirectly. For example, another layer may be provided between the insulating film 7 and the light-shielding member 6. The light-shielding member 6 may be made of a material not having conductivity. If the light-shielding member 6 is made of a material not having conductivity, the insulating film 7 does not have to cover the portion 6a of the light-shielding member 6. In this case, the insulating film 7 may cover just the portion 6b. For example, the insulating film 7 may cover an entire surface of the light-shielding member 6. In other words, the one end of the light-shielding member 6 in the Z axis direction does not have to be exposed from the semiconductor substrate 3.

If each of the plurality of cells U includes a plurality of avalanche photodiodes APD, then in each cell U, the plurality of avalanche photodiodes APD included in the cell U may be arrayed in a matrix. In each cell U, the cathodes and the anodes of the plurality of avalanche photodiodes APD included in the cell U may respectively be electrically connected mutually. In each cell U, an electrode connected to a wire electrically connecting and applying the bias voltage to each of the plurality of avalanche photodiodes APD included in the cell U or connected to a wire electrically connecting and reading out the signals from each of the plurality of avalanche photodiodes APD included in the cell U may be provided.

The distance α between abovementioned connection portion of the branch wire 45 (connection wire 45b) and the semiconductor region 31 may be substantially equivalent to the distance β between the trench 34 and the semiconductor region 31. On the other hand, when the distance a is greater than the distance β, the withstand voltage between the branch wire 45 and the semiconductor region 31 is improved.

The light-shielding member 6 may be made of a material that absorbs light. On the other hand, when the light-shielding member 6 is made of a material that reflects light, the detection sensitivity of the incident light at the semiconductor photodetection device 1 may be improved as mentioned above.

The main surface 3A does not have to include the tapered surface 33c. That is, the entirety of the main surface 3A may be substantially flat. On the other hand, when the main surface 3A includes the tapered surface 33c, the detection sensitivity of the incident light at the semiconductor photodetection device 1 may be improved as mentioned above.

REFERENCE SIGNS LIST

1, 60, 70 semiconductor photodetection device
2 glass substrate
3, 61, 71 semiconductor substrate
3A, 3B main surface
31 to 33, 64, 65, 72, 73 semiconductor region
33c tapered surface
34 trench
42, 43, 62, 63 wire
45, 47 branch wire
46, 48 common wire
6 light-shielding member
6a, 6b portion
7 insulating film
U cell
APD avalanche photodiode.

The invention claimed is:
1. A semiconductor photodetection device comprising:
a semiconductor substrate having a first main surface and a second main surface that oppose each other and a plurality of cells that are arrayed two-dimensionally in a matrix, wherein the second main surface is a boundary between the semiconductor substrate and a region different from a semiconductor region;
a first wire that is disposed on the first main surface of the semiconductor substrate and is electrically connected to each of the plurality of cells;
a second wire that is disposed on the first main surface of the semiconductor substrate and is electrically connected to each of the plurality of cells;
a light-shielding member that optically separates mutually adjacent cells of the plurality of cells; and
an insulating film that covers the light-shielding member; and
wherein each of the plurality of cells includes at least one avalanche photodiode arranged to operate in a Geiger mode,
the avalanche photodiode includes a first semiconductor region and a second semiconductor region of a conductivity type differing from the first semiconductor region,
the first semiconductor region and the second semiconductor region form a portion of the first main surface,
the first wire is electrically connected to the first semiconductor region of the avalanche photodiode included in each of the plurality of cells, the second wire is electrically connected to the second semiconductor region of the avalanche photodiode included in each of the plurality of cells, a trench penetrating through the semiconductor substrate is formed in the semiconductor substrate to surround each of the plurality of cells when viewed in a direction orthogonal to the first main surface, the light-shielding member includes a first portion extending in a thickness direction of the semiconductor substrate between an opening end of the trench at the first main surface and an opening end of the trench at the second main surface, and a second portion projecting out from the second main surface, the insulating film includes a portion that covers the second portion, and at least a portion of the insulating film contacts a side surface of the trench.

2. The semiconductor photodetection device according to claim 1, wherein the light-shielding member is made of a material that reflects light.

3. The semiconductor photodetection device according to claim 1, wherein the insulating film includes a portion that contacts the side surface of the trench and covers the first portion, and the portion that covers the second portion and the portion that covers the first portion are formed integrally.

4. The semiconductor photodetection device according to claim 1, further comprising: a holding member that holds the semiconductor substrate; and an adhesive layer that adheres the holding member and the second main surface together; and wherein the second portion and the portion of the insulating film that covers the second portion are positioned inside the adhesive layer.

5. The semiconductor photodetection device according to claim 1, wherein the plurality of cells are arrayed two-dimensionally in M rows and N columns (M and N are integers not less than 2), the first wire includes a plurality of first branch wires that are respectively provided for each of M first cell groups each including N cells aligned in a row direction, the second wire includes a plurality of second branch wires that are respectively provided for each of N second cell groups each including M cells aligned in a column direction, each of the first branch wires is electrically connected to the N cells included in a corresponding first cell group among the M first cell groups, and each of the second branch wires is electrically connected to the M cells included in a corresponding second cell group among the N second cell groups.

6. The semiconductor photodetection device according to claim 5, wherein each of the second branch wires is connected to the second semiconductor region of the avalanche photodiode included in a corresponding cell among the plurality of cells, and a shortest distance between the first semiconductor region and a connection portion of the second branch wire and the second semiconductor region is greater than a shortest distance between the first semiconductor region and the trench.

7. A semiconductor photodetection device comprising:

a semiconductor substrate having a first main surface and a second main surface that oppose each other and a plurality of cells that are arrayed two-dimensionally in a matrix;

a first wire that is disposed on the first main surface of the semiconductor substrate and is electrically connected to each of the plurality of cells;

a second wire that is disposed on the first main surface of the semiconductor substrate and is electrically connected to each of the plurality of cells;

a light-shielding member that optically separates mutually adjacent cells of the plurality of cells; and an insulating film that covers the light-shielding member; and wherein each of the plurality of cells includes at least one avalanche photodiode arranged to operate in a Geiger mode, the avalanche photodiode includes a first semiconductor region and a second semiconductor region of a conductivity type differing from the first semiconductor region, the first semiconductor region and the second semiconductor region form a portion of the first main surface, the first wire is electrically connected to the first semiconductor region of the avalanche photodiode included in each of the plurality of cells, the second wire is electrically connected to the second semiconductor region of the avalanche photodiode included in each of the plurality of cells, a trench penetrating through the semiconductor substrate is formed in the semiconductor substrate to surround each of the plurality of cells when viewed in a direction orthogonal to the first main surface, the light-shielding member includes a first portion extending in a thickness direction of the semiconductor substrate between an opening end of the trench at the first main surface and an opening end of the trench at the second main surface, and a second portion projecting out from the second main surface, the insulating film includes a portion that covers the second portion, each region of the semiconductor substrate surrounded by the trench includes a first region positioned at an inner side and a second region positioned at an outer side of the first region to surround the first region when viewed in the direction orthogonal to the first main surface, and the second main surface includes a tapered surface that is inclined such that a length of the second region in the thickness direction of the semiconductor substrate increases as a distance to the trench decreases.

8. A semiconductor photodetection device comprising:

a semiconductor substrate having a first main surface and a second main surface that oppose each other and a plurality of cells that are arrayed two-dimensionally in a matrix;

a first wire that is disposed on the first main surface of the semiconductor substrate and is electrically connected to each of the plurality of cells;

a second wire that is disposed on the first main surface of the semiconductor substrate and is electrically connected to each of the plurality of cells;

a light-shielding member that optically separates mutually adjacent cells of the plurality of cells; and an insulating film that covers the light-shielding member; and wherein each of the plurality of cells includes at least one avalanche photodiode arranged to operate in a Geiger mode, the avalanche photodiode includes a first semiconductor region and a second semiconductor region of a conductivity type differing from the first semiconductor region, the first semiconductor region and the second semiconductor region form a portion of the first main surface, the first wire is electrically connected to the first semiconductor region of the avalanche photodiode included in each of the plurality of cells, the second wire is electrically connected to the second semiconductor region of the avalanche photodiode included in each of the plurality of cells, a trench penetrating through the semiconductor substrate is formed in the semiconductor substrate to surround each of the plurality of cells when viewed in a direction orthogonal to the first main surface, the light-shielding member includes a first portion extending in a thickness direction of the semiconductor substrate between an opening end of the trench at the first main surface and an opening end of the trench at the second main surface, and a second portion projecting out from the second main surface, the insulating film includes a portion that covers the second portion, the plurality of cells are arrayed two-dimensionally in M rows and N columns (M and N are integers not less than 2), the first wire includes a plurality of first branch wires, the second wire includes a plurality of second branch wires, each of the plurality of first branch wires and each of the plurality of second branch wires are provided alternately along a column direction in which M cells are aligned, each of the first branch wires is electrically connected to (2×N) cells included in first cell groups of the (2×m−1)th row and the (2×m)th row among M first cell groups each including N cells aligned in a row direction, each of the second branch wires is electrically connected to (2×N) cells included in first cell groups of the (2×m)th row and the (2×m+1)th row among the M first cell groups, and m is an integer not less than 1.

9. The semiconductor photodetection device according to claim 8, wherein each of the second branch wires is connected to the second semiconductor region of the avalanche photodiode included in a corresponding cell among the plurality of cells, and a shortest distance between the first semiconductor region and a connection portion of the second branch wire and the second semiconductor region is greater than a shortest distance between the first semiconductor region and the trench.

\* \* \* \* \*